(12) United States Patent
Xia et al.

(10) Patent No.: US 12,189,313 B2
(45) Date of Patent: *Jan. 7, 2025

(54) CLEANING A STRUCTURE SURFACE IN AN EUV CHAMBER

(71) Applicant: ASML Netherlands B.V., Veldhoven (NL)

(72) Inventors: Chunguang Xia, San Diego, CA (US); Jonghoon Baek, Saratoga, CA (US); John Tom Stewart, IV, Escondido, CA (US); Andrew David LaForge, Poway, CA (US); Deniz Van Heijnsbergen, San Diego, CA (US); David Robert Evans, Poway, CA (US); Nina Vladimirovna Dziomkina, San Diego, CA (US); Yue Ma, Escondido, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 17/680,784

(22) Filed: Feb. 25, 2022

(65) Prior Publication Data
US 2022/0179328 A1 Jun. 9, 2022

Related U.S. Application Data

(63) Continuation of application No. 16/961,747, filed as application No. PCT/EP2019/053350 on Feb. 12, 2019, now Pat. No. 11,347,154.
(Continued)

(51) Int. Cl.
G03F 7/00 (2006.01)
H01J 37/32 (2006.01)
H05H 1/46 (2006.01)

(52) U.S. Cl.
CPC ...... *G03F 7/70925* (2013.01); *G03F 7/70033* (2013.01); *G03F 7/70175* (2013.01);
(Continued)

(58) Field of Classification Search
CPC .... G03F 7/70; G03F 7/70033; G03F 7/70841; G03F 7/70858; G03F 7/70866;
(Continued)

(56) References Cited

U.S. PATENT DOCUMENTS 5,514,246 A * 5/1996 Blalock ............. H01J 37/32082
134/1.1
9,557,650 B2 1/2017 De Dea et al.
(Continued)

FOREIGN PATENT DOCUMENTS

CN 101611351 A 12/2009
EP 0673186 A1 9/1995
(Continued)

OTHER PUBLICATIONS

English translation of JP2008-042078, published Feb. 21, 2008. (Year: 2008).*
(Continued)

*Primary Examiner* — Christina A Riddle
(74) *Attorney, Agent, or Firm* — DiBerardino McGovern IP Group LLC

(57) ABSTRACT

In some general aspects, a surface of a structure within a chamber of an extreme ultraviolet (EUV) light source is cleaned using a method. The method includes generating a plasma state of a material that is present at a location adjacent to a non-electrically conductive body that is within the chamber. The generation of the plasma state of the material includes electromagnetically inducing an electric current at the location adjacent the non-electrically conductive body to thereby transform the material that is adjacent (Continued)

the non-electrically conductive body from a first state into the plasma state. The plasma state of the material includes plasma particles, at least some of which are free radicals of the material. The method also includes enabling the plasma particles to pass over the structure surface to remove debris from the structure surface without removing the structure from the chamber of the EUV light source.

16 Claims, 24 Drawing Sheets

Related U.S. Application Data

(60) Provisional application No. 62/795,107, filed on Jan. 22, 2019, provisional application No. 62/630,036, filed on Feb. 13, 2018.

(52) U.S. Cl.
CPC ...... *G03F 7/70916* (2013.01); *G03F 7/70983* (2013.01); *H01J 37/321* (2013.01); *H01J 37/32862* (2013.01); *H05H 1/46* (2013.01); *H05H 1/463* (2021.05)

(58) Field of Classification Search
CPC . G03F 7/70883; G03F 7/70908–70941; G03F 7/7095; G03F 7/70958; G03F 7/70975; G03F 7/70991; G03F 7/7015; G03F 7/701491; G03F 7/70175; H01J 37/321; H01J 37/32862; H05G 2/00–008; H05H 1/46; H05H 1/463; H05H 1/4652; H05H 1/466
USPC ..... 355/18, 30, 52–55, 67–77, 133; 134/1.1; 250/492.1, 492.2–492.23, 493.1, 494.1, 250/503.1, 504 R, 505.1
See application file for complete search history.

(56) References Cited

U.S. PATENT DOCUMENTS

| | | | |
|---|---|---|---|
| 9,867,269 B2 | 1/2018 | Ruzic et al. | |
| 9,888,554 B2 | 2/2018 | Baek et al. | |
| 10,531,553 B2 | 1/2020 | Ruzic et al. | |
| 11,347,154 B2* | 5/2022 | Xia | H05H 1/4652 |
| 2004/0099820 A1 | 5/2004 | Bristol | |
| 2005/0016679 A1 | 1/2005 | Ruzic et al. | |
| 2006/0163500 A1 | 7/2006 | Inoue et al. | |
| 2007/0018119 A1 | 1/2007 | Yabuta et al. | |
| 2007/0062557 A1* | 3/2007 | Rakhimova | G03F 7/70933 |
| | | | 134/1.1 |
| 2007/0125964 A1* | 6/2007 | Van Herpen | G03F 7/70916 |
| | | | 250/492.2 |
| 2008/0142736 A1 | 6/2008 | Wassink et al. | |
| 2009/0014027 A1* | 1/2009 | Schriever | G03F 7/70933 |
| | | | 134/1.1 |
| 2009/0154642 A1* | 6/2009 | Bykanov | H05G 2/003 |
| | | | 378/34 |
| 2010/0075066 A1 | 3/2010 | Ueda et al. | |
| 2010/0101728 A1 | 4/2010 | Iwasaki | |
| 2011/0043774 A1 | 2/2011 | Hembacher et al. | |
| 2011/0180213 A1 | 7/2011 | Hirayama et al. | |
| 2011/0310365 A1 | 12/2011 | Yabu et al. | |
| 2012/0049415 A1 | 3/2012 | George et al. | |
| 2012/0068603 A1 | 3/2012 | Itoh et al. | |
| 2012/0119116 A1* | 5/2012 | Kakizaki | G03F 7/70033 |
| | | | 250/504 R |
| 2012/0148761 A1 | 6/2012 | Stowell et al. | |
| 2012/0223256 A1 | 9/2012 | Bykanov et al. | |
| 2013/0126761 A1 | 5/2013 | Nagai et al. | |
| 2014/0315347 A1 | 10/2014 | Ruzic et al. | |
| 2015/0069273 A1 | 3/2015 | De Dea et al. | |
| 2015/0282287 A1 | 10/2015 | De Dea et al. | |
| 2016/0299443 A1 | 10/2016 | Anderl et al. | |
| 2016/0377985 A1 | 12/2016 | Nienhuys | |
| 2017/0215265 A1* | 7/2017 | Baek | G02B 27/0006 |

FOREIGN PATENT DOCUMENTS

| | | | |
|---|---|---|---|
| JP | 2008042078 A * | 2/2008 | |
| JP | 2009016640 A | 1/2009 | |
| JP | 2011514687 A | 5/2011 | |
| JP | 4974318 B2 | 7/2012 | |
| JP | 2013084993 A | 5/2013 | |
| JP | 2016534409 A | 11/2016 | |
| WO | 2013092094 A1 | 6/2013 | |
| WO | 2017127182 A1 | 7/2017 | |

OTHER PUBLICATIONS

Wiebo van Toledo, European International Searching Authority, International Search Report and Written Opinion, corresponding PCT Application No. PCT/EP2019/053350, mailed Jun. 21, 2019, 15 pages total.
Daniel T. Elg et al., "In situ collector cleaning and extreme ultraviolet reflectivity restoration by hydrogen plasma for extreme ultraviolet sources," J. Vac. Sci. Technol. A, vol. 34, 021305 (2016), doi: 10.1116/1.4942456.
Gianluca Panici et al., "Study of Sn Removal by Surface Wave Plasma for Source Cleaning," Proc. SPIE, vol. 10143, Extreme Ultraviolet (EUV) Lithography VIII, 101432I (2017), doi: 10.1117/12.2258065.
H. Shin et al., "Contamination Removal from Collector Optics and Masks: An Essential Step for Next Generation Lithography," Proc. SPIE, vol. 6518 65184N (2007), doi: 10.1117/12.712372.
H. Shin et al., "Tin removal from extreme ultraviolet collector optics by inductively coupled plasma reactive ion etching," J. Vac. Sci Technol. A, vol. 26 (2008), doi: 10.1116/1.2899332.
H. Shin et al., "Sn debris cleaning by plasma in DPP EUV source systems for HVM," Proc. SPIE, vol. 7636, 76360B (2010), doi: 10.1117/12.846359.
JPO, Office Action, counterpart Japanese Patent Application No. 2020-537739, mailed Mar. 7, 2023, 9 pages total (including English translation of 4 pages).
The Patent Office of the People's Republic of China, Office Action and Search Report, counterpart Chinese Patent Application No. 201980012976.1, mailed Mar. 9, 2023, 24 pages total (including partial English translation of 11 pages).

* cited by examiner

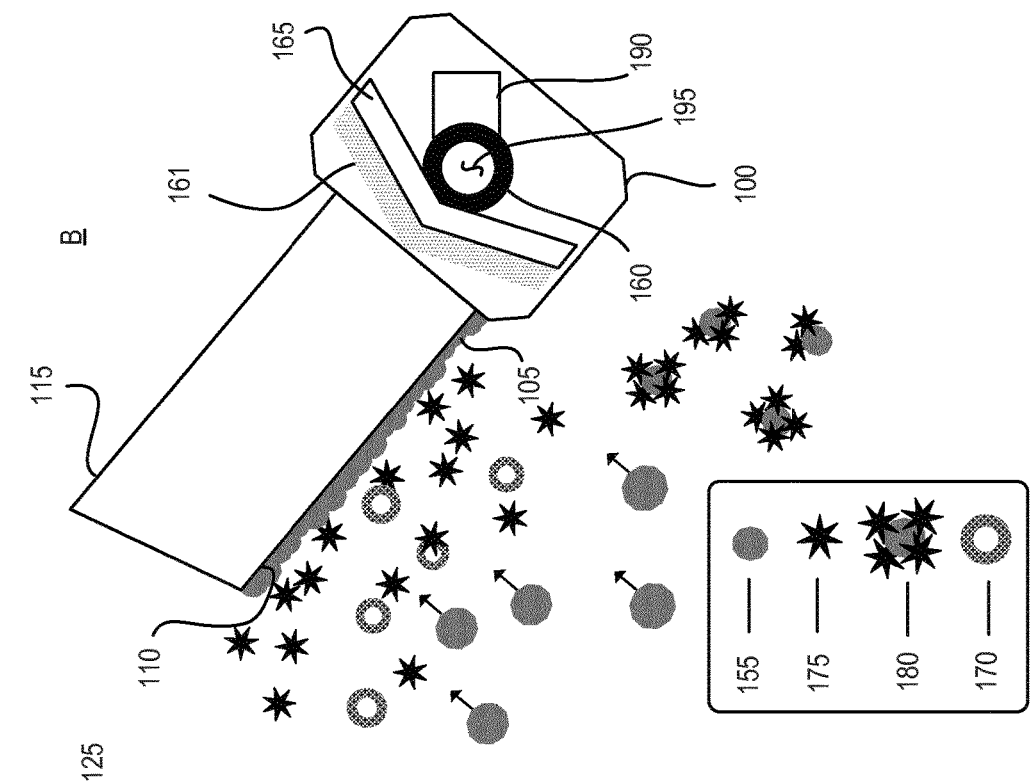
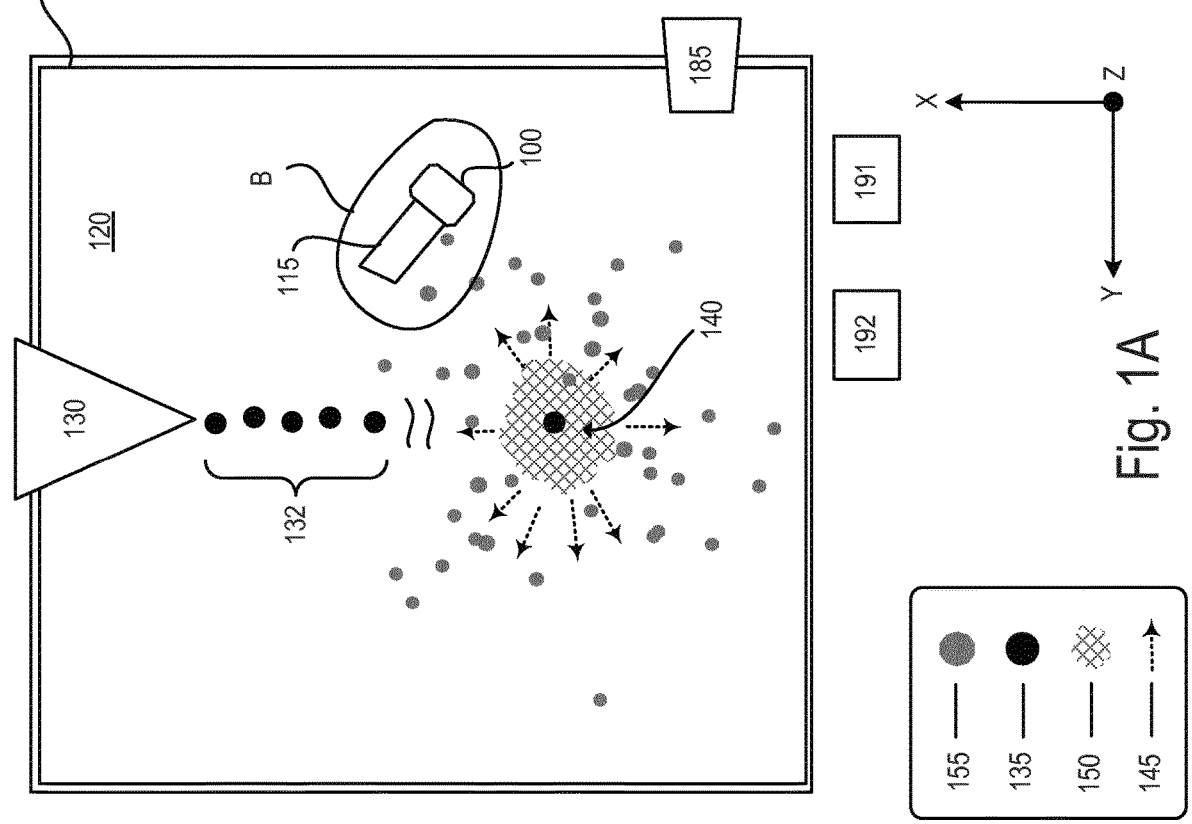

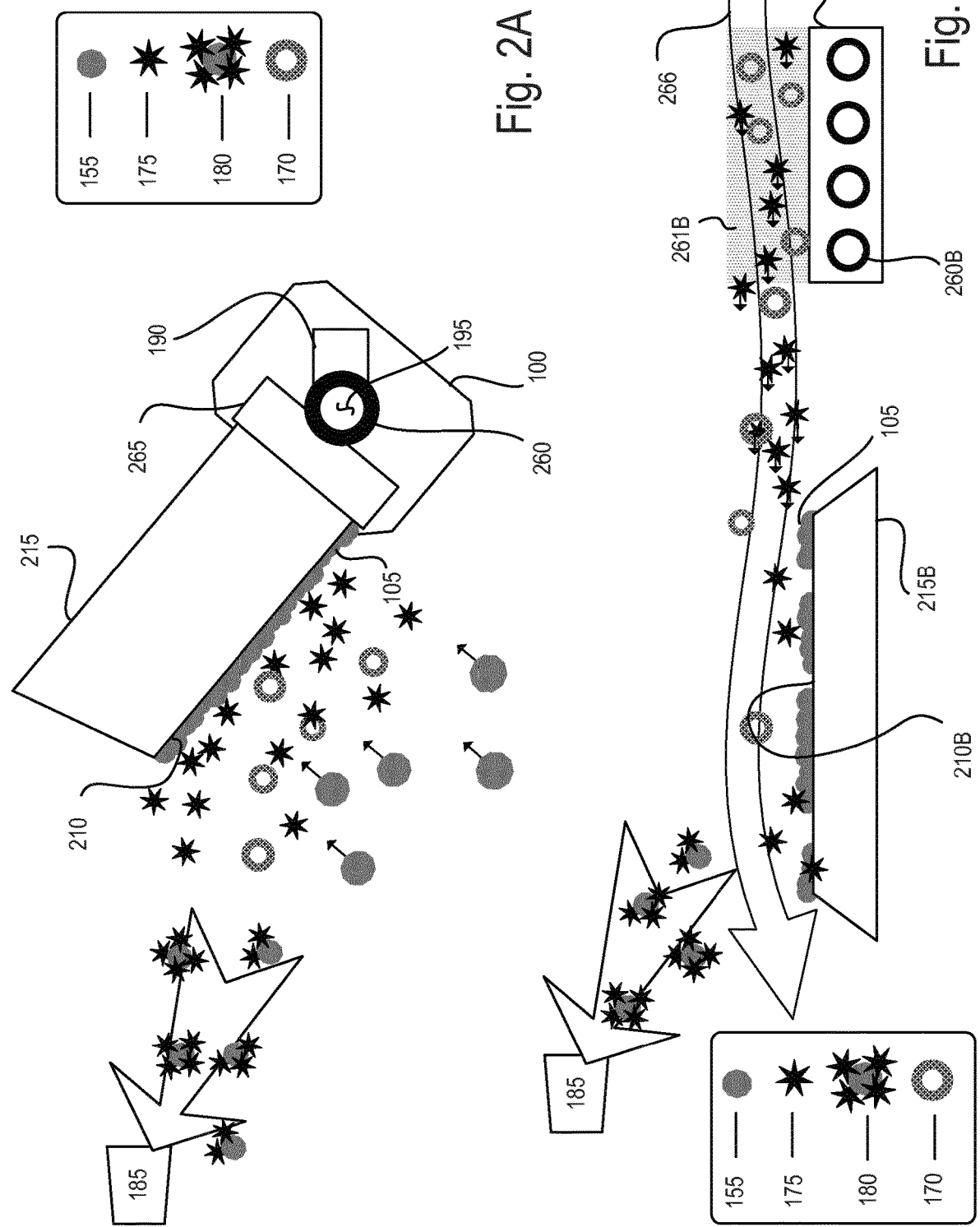

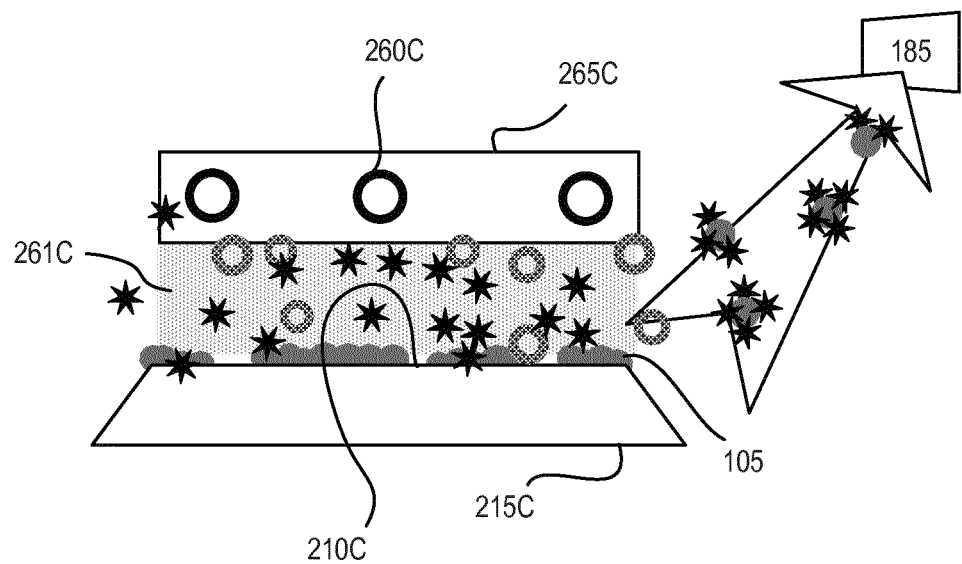
Fig. 2C
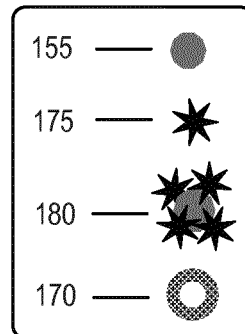

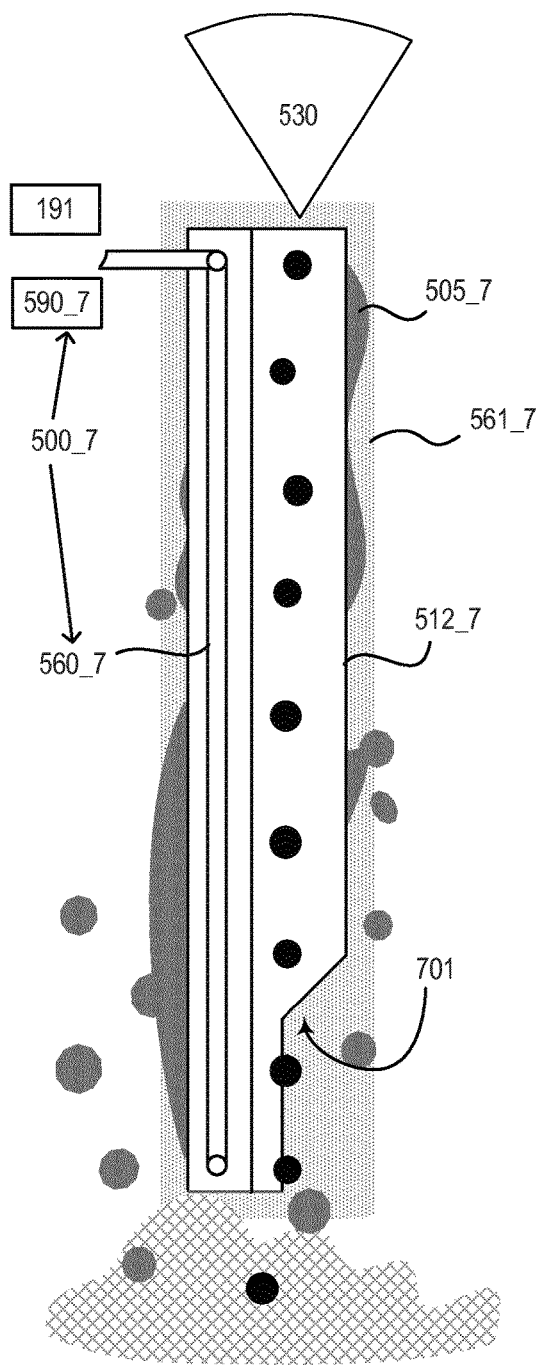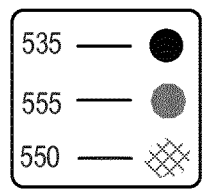
Fig. 7B
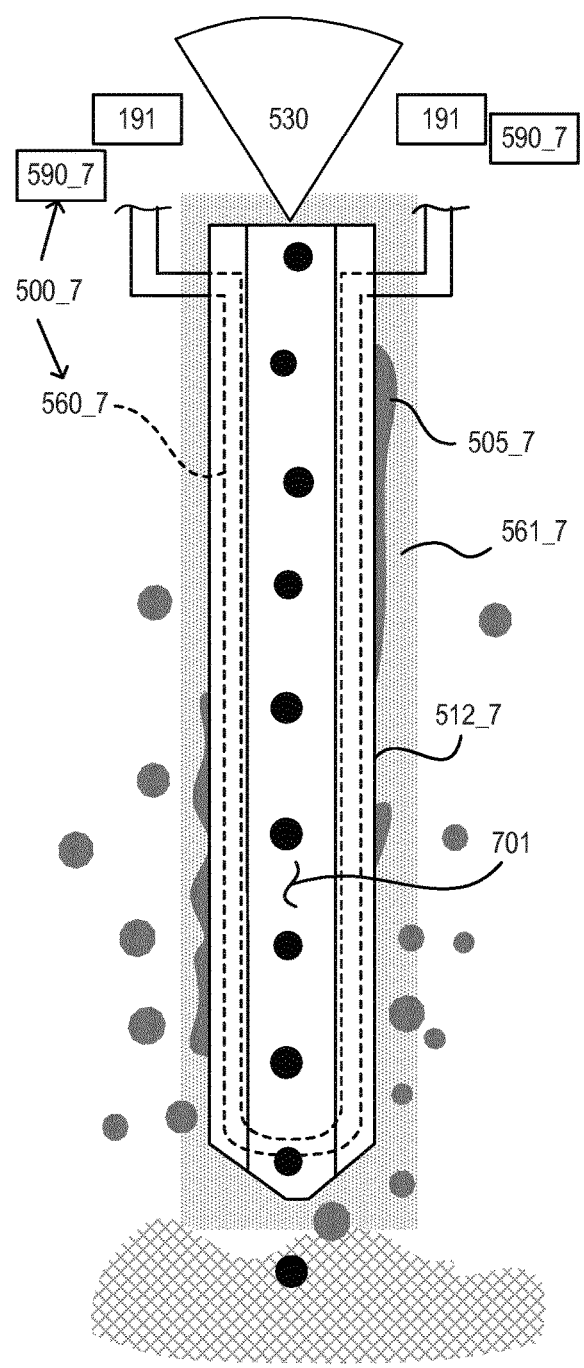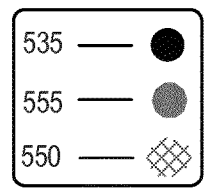
Fig. 7C

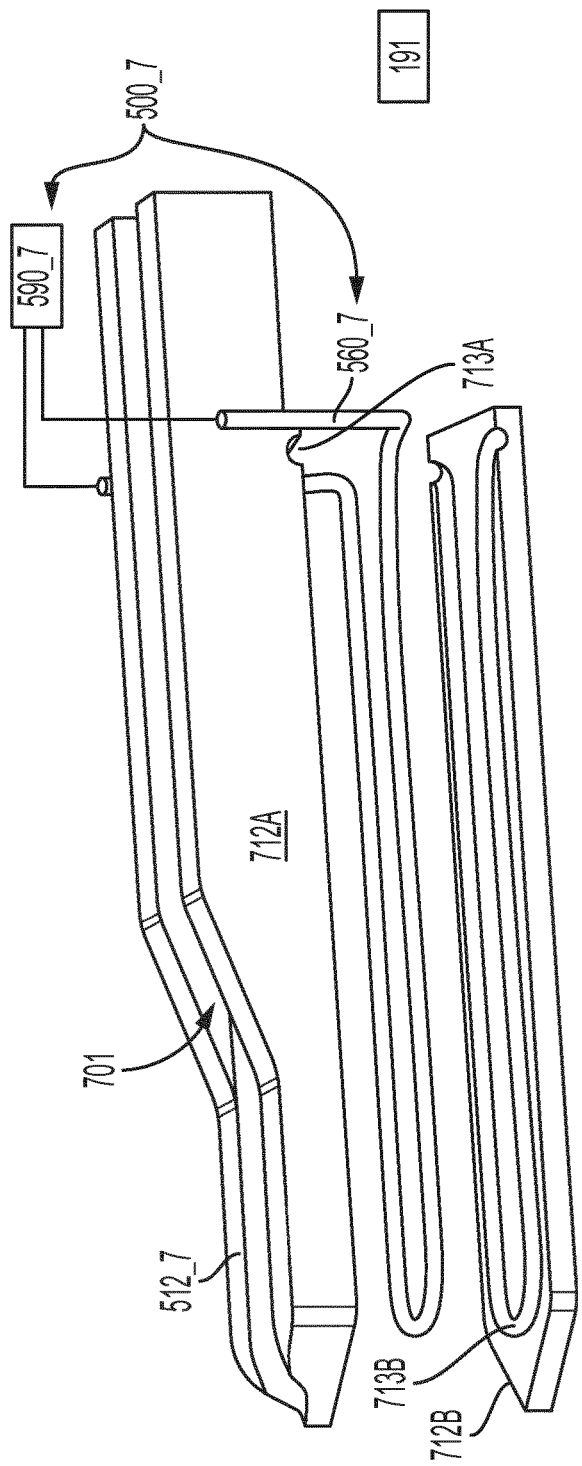
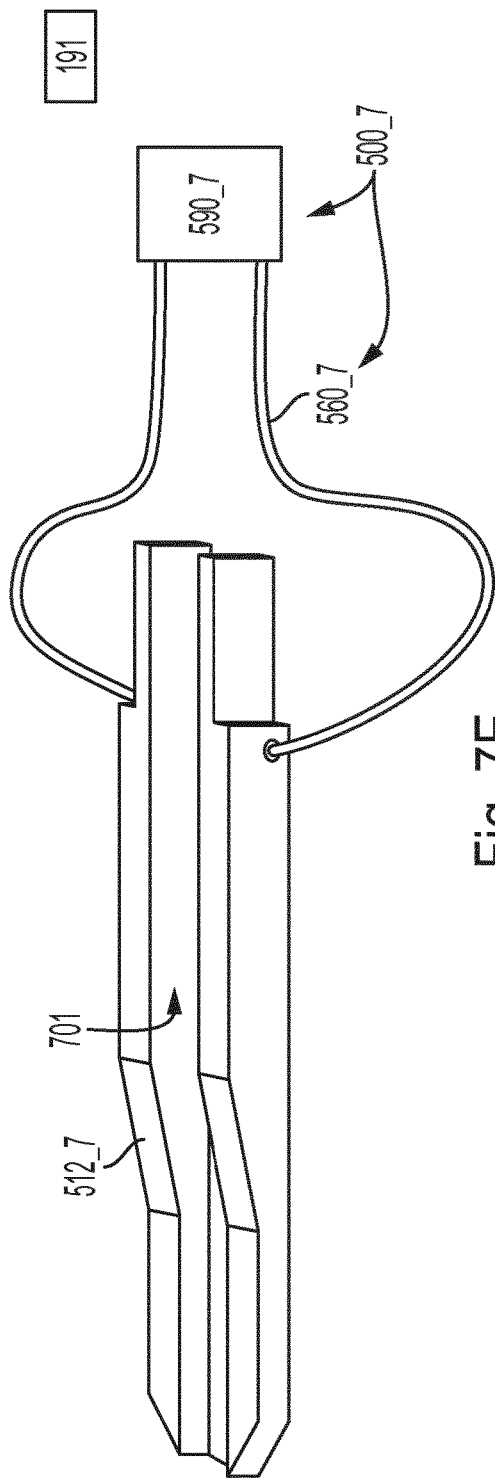
Fig. 7D
Fig. 7E

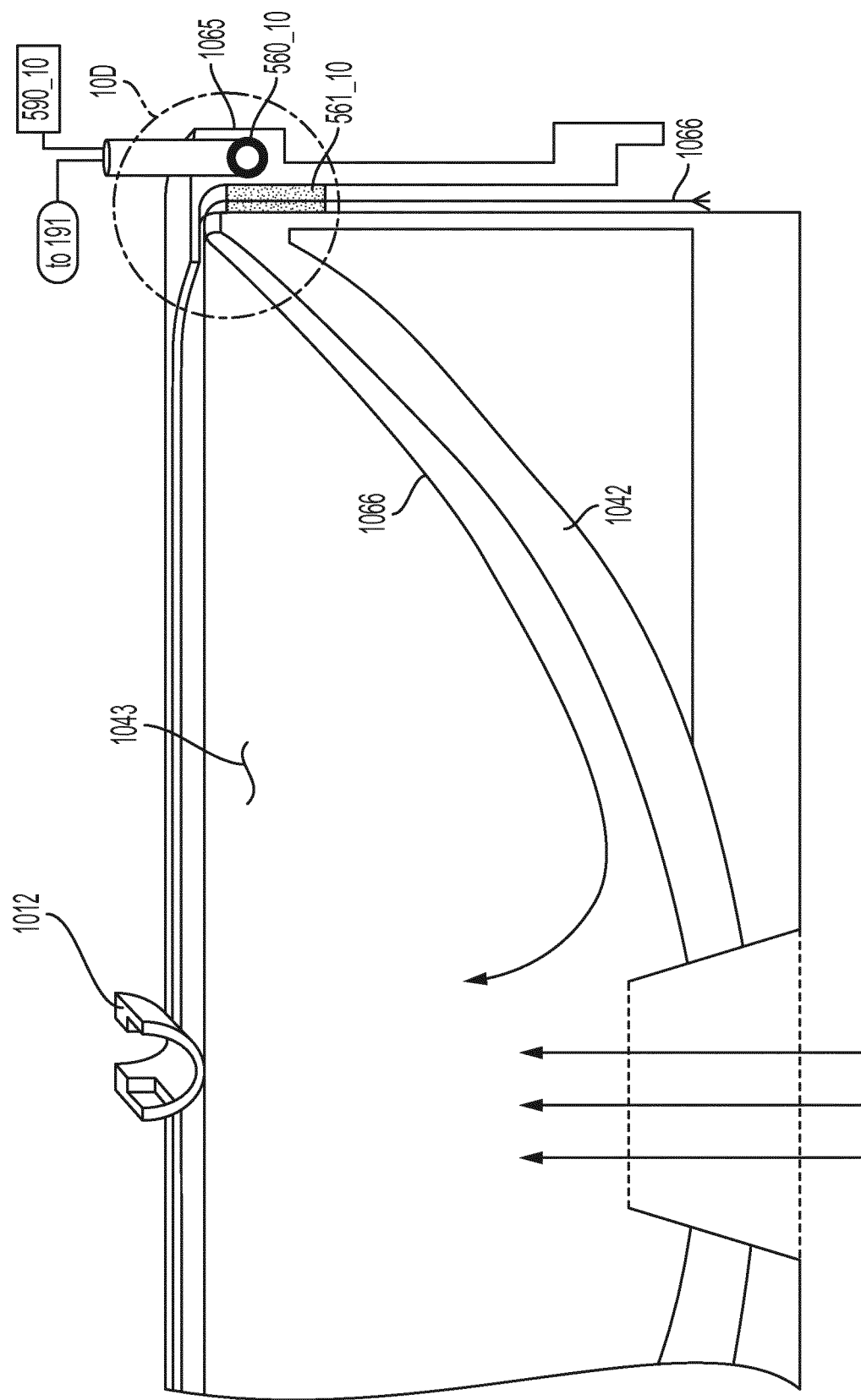

CLEANING A STRUCTURE SURFACE IN AN EUV CHAMBER

CROSS-REFERENCE TO RELATED APPLICATIONS

This application is a continuation of U.S. application Ser. No. 16/961,747, titled CLEANING A STRUCTURE SURFACE IN AN EUV CHAMBER, which is the national phase of PCT/EP2019/053350, filed on Feb. 12, 2019 and titled CLEANING A STRUCTURE SURFACE IN AN EUV CHAMBER, which claims priority to U.S. Application No. 62/630,036, filed on Feb. 13, 2018 and titled CLEANING A STRUCTURE SURFACE IN AN EUV CHAMBER, and to U.S. Application No. 62/795,107 filed on Jan. 22, 2019 and titled CLEANING A STRUCTURE SURFACE IN AN EUV CHAMBER. Each of these applications is incorporated herein in its entirety by reference.

TECHNICAL FIELD

The disclosed subject matter relates to a system and method for cleaning debris from a surface of a structure within a chamber of an extreme ultraviolet light source.

BACKGROUND

Extreme ultraviolet (EUV) light, for example, electromagnetic radiation having wavelengths of around 50 nm or less (also sometimes referred to as soft x-rays), and including light at a wavelength of about 13 nm, can be used in photolithography processes to produce extremely small features in substrates, for example, silicon wafers.

Methods to produce EUV light include, but are not necessarily limited to, converting a material that has an element, for example, xenon, lithium, or tin, with an emission line in the EUV range in a plasma state. In one such method, often termed laser produced plasma ("LPP"), the required plasma can be produced by irradiating a target material, for example, in the form of a droplet, plate, tape, stream, or cluster of material, with an amplified light beam. For this process, the plasma is typically produced in a sealed vessel, for example, a vacuum chamber, and monitored using various types of metrology equipment.

SUMMARY

In some general aspects, a surface of a structure within a chamber of an extreme ultraviolet (EUV) light source is cleaned using a method. The method includes generating a plasma state of a material that is present at a location adjacent to a non-electrically conductive body that is within the chamber. The generation of the plasma state of the material includes electromagnetically inducing an electric current at the location adjacent the non-electrically conductive body to thereby transform the material that is adjacent the non-electrically conductive body from a first state into the plasma state. The plasma state of the material includes plasma particles, at least some of which are free radicals of the material. The method also includes enabling the plasma particles to pass over the structure surface to remove debris from the structure surface without removing the structure from the chamber of the EUV light source.

Implementations can include one or more of the following features. For example, the method can include maintaining a temperature of the structure below 50° C.

The structure surface can be positioned to optically interact with and modify light present in the chamber.

The plasma state of the material can be generated by generating the plasma state of the material without the presence of oxygen. The plasma state of the material can be generated by generating the plasma state of the material without reducing the amount of material flowing across the structure surface.

The electric current can be electromagnetically induced by flowing an electric current through an electrically conductive tubing adjacent the non-electrically conductive body. The electric current flowing through the electrically conductive tubing can be at radio frequency. The method can include providing a cooling fluid through an interior of the electrically conductive tubing to maintain a temperature of the non-electrically conductive body or the structure below a threshold temperature.

The structure can include the non-electrically conductive body; and the plasma state of the material can be generated at the location adjacent to the non-electrically conductive body by generating the plasma state of the material at a location adjacent the structure surface.

The structure can be distinct from the non-electrically conductive body. The plasma state of the material can be enabled to pass over the structure surface by moving the plasma particles from a location near the non-electrically conductive body toward and across the structure surface.

The electric current can be electromagnetically induced at the location adjacent the non-electrically conductive body by producing a time-varying magnetic field within the chamber near the non-electrically conductive body; and the time-varying magnetic field can be produced within the chamber by flowing a time-varying electric current through an electrical conductor that is adjacent the non-electrically conductive body.

The plasma particles can include at least ions, electrons, and free radicals of the material. The material can include hydrogen.

The debris can be removed from the structure surface by chemically reacting the plasma particles with the debris on the structure surface to form a chemical that is released from the structure surface. The method can also include removing the released chemical from the chamber. The material can include hydrogen, and the plasma particles can include free radicals of hydrogen. The debris on the substrate surface can includes tin, and the released chemical can include tin hydride.

The chamber can be held at a pressure below atmospheric pressure.

The non-electrically conductive body can be made of a dielectric.

The electric current can be electromagnetically induced by generating microwave radiation at the non-electrically conductive body or propagating an electromagnetic surface wave along the non-electrically conductive body.

The electric current can be electromagnetically induced by flowing an electric current through an electrical conductor adjacent the non-electrically conductive body. The electric current can be flowed through the electrical conductor by applying a first electric current at a first frequency to the electrical conductor and applying a second electric current at a second frequency that is distinct from the first frequency to the electrical conductor. The first frequency can be a radio frequency and the second frequency can be lower than the radio frequency. The first electric current and the second electric current can be applied by applying dual frequency alternating current or a pulsating direct current to the electrical conductor.

The first electric current can be applied at the first frequency to the electrical conductor to thereby transform the material that is adjacent the non-electrically conductive body from a first state into a plasma state of the material that includes the plasma particles. The second electric current can be applied at the second frequency to the electrical conductor to thereby inductively heat and evaporate debris on the structure surface.

In other general aspects, an apparatus includes: an extreme ultraviolet (EUV) light source, a structure within the chamber that includes an exposed surface, and a cleaning apparatus near the structure. The EUV light source includes: a chamber; and a target delivery system configured to direct a target toward an interaction region in the chamber. The target includes matter that emits extreme ultraviolet light when it is converted into a plasma. The cleaning apparatus is configured to remove target debris from the exposed surface of the structure without removing the structure from the chamber. The cleaning apparatus includes an electrical conductor contacting a non-electrically conductive body. The cleaning apparatus is configured to electromagnetically induce an electric current at a location adjacent the non-electrically conductive body to thereby transform a material present in the chamber from a first state into a plasma state that includes plasma particles, at least some of which are free radicals and ions of the material. The non-electrically conductive body is configured relative to the structure such that the plasma particles come in contact with the debris on the exposed surface of the structure.

Implementations can include one or more of the following features. For example, the apparatus can include a temperature control system thermally coupled to the electrical conductor.

The temperature control system can be configured to maintain a temperature of the structure adjacent the cleaning apparatus to within a threshold range. The temperature control system can maintain a temperature of the structure adjacent the cleaning apparatus to below a threshold maximum value. The threshold maximum value can be 50° C. The temperature control system can include a fluid control system that is configured to feed a cooling fluid through an interior passage of the electrical conductor.

The exposed surface can optically interact with and modifies light. The light can be an amplified light beam that interacts with the target or is EUV light produced by the target.

The can include a flow apparatus configured to flow the plasma particles from the location adjacent the non-electrically conductive body toward and over the exposed surface.

The electric current can be electromagnetically induced by flowing an electric current through the electrical conductor, and the electric current flowing through the electrical conductor is at radio frequency.

The structure having the exposed surface and the non-electrically conductive body can be the same physical structure.

The structure having the exposed surface can be physically distinct from the non-electrically conductive body.

The non-electrically conductive body can include a shroud that includes a passageway or defines a pathway for the target from the target delivery system to the interaction region.

The structure having the exposed surface can be a collector mirror of the EUV light source. The collector mirror can be positioned to capture at least a portion of the EUV light emitted from the plasma, and the non-electrically conductive body can include a ring positioned around an outer surface of the collector mirror.

The structure having the exposed surface can be the non-electrically conductive body. The EUV light source can include a liner between the collector mirror and an intermediate focus. The structure can include the liner, an interior surface of the liner facing the EUV light reflected from the collector mirror toward the intermediate focus and constituting the exposed structure surface. The electrical conductor can be positioned outside an exterior surface of the liner if the exterior surface of the liner is at a different pressure than the pressure at the interior surface, or the electrical conductor can be embedded in the liner if the exterior surface of the liner is held at the same pressure as the interior surface. The induced electric current can be at the interior surface of the liner. The liner can have a conical shape that tapers smoothly from a flat base positioned adjacent the collector mirror to an apex that opens to the intermediate focus.

The non-electrically conductive body can be made of a dielectric. The dielectric can include a ceramic. The ceramic can include aluminum nitride or boron nitride.

The target can include tin and the material can include hydrogen. The cleaning apparatus can be configured to remove tin debris from the exposed surface of the structure without the presence of oxygen.

The electrical conductor can be embedded within the non-electrically conductive body if the pressure on first and second sides of the non-electrically conductive body is equal. Or, the electrical conductor can be adjacent to and at an exterior of the first side of the non-electrically conductive body if the pressure on the first side is different from the pressure on the second side of the non-electrically conductive body.

The chamber can be held at a pressure below atmospheric pressure.

The apparatus can include a power source configured to supply current to the electrical conductor. The apparatus can include a control apparatus to which the power source is connected, the control apparatus configured to send a signal to the power source to thereby operate the cleaning apparatus.

The apparatus can include a fluid port configured to introduce the material into the chamber.

The cleaning apparatus can be configured to electromagnetically induce an electric current at a location adjacent the non-electrically conductive body by propagating an electromagnetic surface wave along the non-electrically conductive body or generating microwave radiation at the non-electrically conductive body.

The cleaning apparatus can include a power source electrically connected to supply current to the electrical conductor. The power source can be configured to supply a first electric current at a first frequency to the electrical conductor and a second electric current at a second frequency to the electrical conductor, in which the second frequency is distinct from the first frequency. The first frequency can be a radio frequency and the second frequency can be less than radio frequency. The power source can be configured to apply either a dual frequency alternating current or a pulsating direct current to the electrical conductor.

In other general aspects, an apparatus includes an extreme ultraviolet (EUV) light source including a chamber, and a shroud within the chamber. The EUV light source includes a target delivery system configured to direct a target toward an interaction region in the chamber. The target including matter that emits extreme ultraviolet light when it is converted into a plasma. The shroud defines a channel extending from the target delivery system to the interaction region, exterior surfaces of the shroud being exposed to debris produced from the target. The shroud includes: a non-electrically conductive body that defines the pathway, and an electrical conductor adjacent the non-electrically conductive body. The electrical conductor electromagnetically induces an electric current at a location adjacent the shroud to thereby transform a material present in the chamber from a first state into a plasma state that includes plasma particles, at least some of which are free radicals and ions of the material. The electrical conductor is positioned relative to the non-electrically conductive body such that the plasma particles chemically react with debris fixed to the exposed shroud surfaces to thereby release the debris from the exposed shroud surfaces.

Implementations can include one or more of the following features. For example, apparatus can include a temperature control system thermally coupled to the electrical conductor. The temperature control system can be configured to maintain a temperature of the channel surface below a threshold value. The temperature control system can be configured to cool the channel surface to thereby prevent the debris from melting at the channel surface.

The electrical conductor can be embedded within the non-electrically conductive body. The electrical conductor can be in contact with the non-electrically conductive body.

The non-electrically conductive body can be made of a dielectric.

The electrical conductor can wrap around an exterior surface of the non-electrically conductive body and the electrical conductor can be coated in a dielectric material.

DRAWING DESCRIPTION

FIG. 1A is a block diagram of a cleaning apparatus designed to clean debris from an exposed surface of a structure within a chamber of an extreme ultraviolet (EUV) light source;

FIG. 1B is a block diagram of the cleaning apparatus of FIG. 1A, in which the cleaning apparatus includes an electrical conductor in contact with a non-electrically conductive body that is configured relative to the exposed structure surface;

FIGS. 2A and 2B are block diagrams of an implementation of the cleaning apparatus of FIG. 1A, in which the non-electrically conductive body is distinct from the structure having the exposed surface;

FIG. 2C is a block diagram of another implementation of the cleaning apparatus of FIG. 1A, in which the non-electrically conductive body is distinct from the structure having the exposed surface;

FIG. 7B is a plan view of an implementation of the cleaning apparatus and the shroud that is cleaned in FIG. 7A taken along the XY plane;

FIG. 7C is a plan view of the implementation of the cleaning apparatus and the shroud that is cleaned in FIG. 7B, taken along the XZ plane;

FIG. 7D is an exploded perspective view of the implementation of the cleaning apparatus and the shroud of FIGS. 7A and 7B, showing the placement of the electrical conductor within the shroud;

FIG. 7E is a perspective view of the implementation of the cleaning apparatus and the shroud of FIGS. 7A and 7B;

FIG. 10C is a side cross-sectional view of a portion of the cleaning apparatus of FIG. 10B;

DESCRIPTION

Figure 3A:
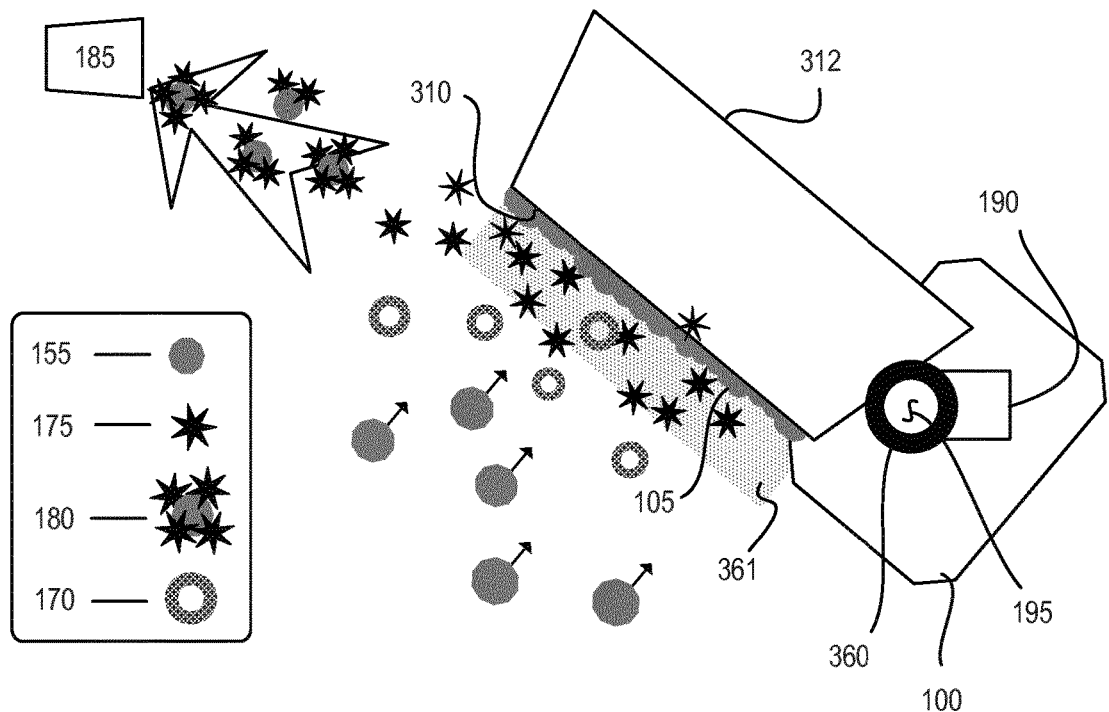
FIGS. 3A and 3B are block diagrams of an implementation of the cleaning apparatus of FIG. 1A, in which the non-electrically conductive body is the structure having the exposed surface.

Referring to FIGS. 1A and 1B, a cleaning apparatus 100 is designed to clean debris 105 off of an exposed surface 110 of a structure 115 within a chamber 120 defined by a vessel 125 of an extreme ultraviolet (EUV) light source. Examples of EUV light sources are shown in FIGS. 5, 7A, 8A, 9A, and 10A. The EUV light source also includes a target delivery system 130 configured to direct a stream 132 of targets 135 toward an interacting region 140 in the chamber 120. The target 135 includes matter that emits EUV light 145 when it is converted into a plasma 150 (which is also referred to as light-emitting plasma 150).

The debris 105 is at least partially produced from leftover or remaining target matter 155 in the chamber 120. In particular, the leftover or remaining target matter 155 can be target matter that is not converted into the plasma 150 in the interacting region 140 and/or the leftover or remaining target matter 155 can be produced from plasma 150 that reverts back into target matter 155. The process of generating the EUV light 145 relies on converting the matter in many targets 135 to plasma 150, and thus a large amount of remaining or leftover target matter 155 can be produced in the process. Different phases of the target matter 155 tend to deposit on surfaces of various objects inside the chamber 120. The target matter 155 that remains or is leftover can travel through the chamber 120 and coat various objects such as walls, optical elements, and components within the chamber 120. The debris 105 that forms on the surfaces of these objects can include vapor residue, ions, particles, and/or clusters of matter formed from the target matter 155.

The debris 105 can severely impair the performance of the EUV light source by blocking the EUV light 145 or by contaminating the objects within the chamber 120. The debris 105 forms a coating on the surface 110 that effectively blocks the surface 110. Thus, if the surface 110 is an optical surface that is meant to interact with light in the chamber 120, its efficiency will drop as it becomes coated with debris 105. As another example, if the surface 110 is a non-optical surface (that does not interact with light), then the debris 105 coating the surface 110 can cause other serious problems within the chamber 120. The debris 105 can cause the surface 110 and the structure 115 to heat up, which can lead to the debris 105 being ejected from the surface 110 and onto other elements within the chamber 120. The debris 105 can cause other problems that lead to a reduction in the production of EUV light 145. For example, the debris 105 can be flaked off, dropped off, spit off, or dripped off the surface 110. In summary, the presence of such debris 105 can reduce the performance of the surfaces within the chamber 120 and reduce the overall efficiency of the EUV light source and production of EUV light 145. As discussed below, if the target 135 includes molten metal of tin, then tin particles, clusters of tin, tin residue, or tin ions can accumulate on (or coat) one or more structures within the chamber 120.

The debris 105 can be produced from materials other than the target matter 155 that are present within the chamber 120. For example, the debris 105 can include carbon.

As shown in FIG. 1B, the cleaning apparatus 100 is positioned within the chamber 120 and close enough to the structure 115 to enable the removal of the debris 105 from the exposed surface 110, as discussed next. The cleaning apparatus 100 includes an electrical conductor 160 contacting a non-electrically conductive body 165. The electrical conductor 160 is configured to electromagnetically induce an electric current at a location (which is a volume) 161 adjacent the structure 115 to thereby transform material 170 that is present in the chamber 120 from a first state of matter (for example, vapor or liquid) into a plasma state of matter.

The material 170 can be present within the chamber 120 in that the material 170 already exists within the chamber 120 independently of the operation of the cleaning apparatus 100. In typical implementations, the chamber 120 is initially manufactured without introducing material 170; then, material 170 is subsequently introduced prior to and/or during operation of chamber 120. Material 170 is then present in the chamber during operation of the chamber 120. Thus, the material 170 does not need to be transported into the chamber 120 from outside the chamber 120 prior to operation of the cleaning apparatus 100 because the material 170 is already present in the chamber 120 for operation of the chamber 120. The material 170 can be transported into the chamber 120 via a fluid port in the vessel 125. For example, the material 170 can be supplied within the chamber 120 for other purposes during operation of the EUV light source such as to provide a fluid flow pattern or to provide a buffer over surfaces within the chamber 120.

The electrical conductor 160 acts as an inductively-coupled plasma (ICP) tool, which includes, as the plasma generator, the electrical conductor 160 placed to be in contact with the structure 115. In the ICP process, a time-varying electric current is flowed (from the power source) through the electrical conductor 160, and the flow of the time-varying electric current produces a time-varying magnetic field adjacent this electrical conductor 160. The produced time-varying magnetic field induces an electric field or current at the location 161 adjacent the structure 115. The induced electric current is large enough to generate, from the nearby material, the plasma state of matter at the location 161.

The plasma state of the material 170 includes plasma particles 175 of the material 170, and these plasma particles 175 are quite chemically reactive. For example, the plasma particles 175 can include free radicals and/or ions of the material 170. The electrical conductor 160 is positioned such that the plasma particles 175 come in contact with the debris 105 on the exposed surface 110. The plasma particles 175 chemically react with the deposited target matter 155 of the debris 105 to form a new chemical 180 that is released from the exposed surface 110. For example, the new chemical 180 can be in a gaseous state, and thus becomes released from the exposed surface 110 upon formation. This new chemical 180, which is in the gaseous state, can then be pumped out of the chamber 120 by way of a removal apparatus 185.

The cleaning apparatus 100 can be configured to operate (that is remove the debris 105 from the exposed surface 110)

even though it is exposed to molecular hydrogen, which is present in the chamber 120. Moreover, the cleaning apparatus 100 can be configured to operate without the use of or presence of oxygen; that is, oxygen is not needed or required in order for the cleaning apparatus 100 to operate and/or perform its functions.

The cleaning apparatus 100 is designed to remove the debris 105 from the exposed surface 110 of the structure 115 without requiring the removal of the structure 115 from the chamber 120. The operation of the structures 115 within the chamber 120 that contribute to the production of the EUV light 145 and/or maintain the operation of the chamber 120 need not be halted in order to clean the exposed surfaces 110 of those structures 115. Thus, the operation of the EUV light source does not need to be halted or shut down in order for the cleaning apparatus 100 to clean the surface 110. The cleaning apparatus 100 is able to remove most if not all of the debris 105 from the surfaces 110 within the chamber 120. The cleaning apparatus 100 operates to prevent the ejection of the debris 105 (such as by spitting, flaking, or dripping) from the exposed surface 110. Moreover, the cleaning apparatus 100 can be fluidly cooled, and because of this, it is more reliable thermally, less complex, and cheaper than previous designs that required heating of components within the chamber 120 in order to reduce the detrimental effect of the target matter 155. For example, in prior designs that heat the structure 115 to remove the debris 105, spitting of the debris 105 occurs. The cleaning apparatus 100, on the other hand, does not heat the structure 115, and thus spitting is mitigated or avoided completely. In particular, the temperature of the chamber 120 overall is lower and the structure 115 is not heated, and the overall temperature of the structure 115 is lower than the melting point of the debris 105. Moreover, the consumption of the material 170 is reduced or minimized because any plasma particles 175 that do not interact with the target matter 155 in the debris 105 will reform into material 170.

In some implementations, the chamber 120 is maintained at atmospheric pressure. In other implementations, the chamber 120 is maintained at a vacuum, that is, at a pressure below atmospheric pressure. For example, the chamber 120 can be at a low pressure of between about 0.5 Torr (T) to about 1.5 T (for example, at 1 T). A particular pressure may be suitable for the most efficient generation of EUV light 145. The cleaning apparatus 100 is configured to operate in the environment of the chamber 120, and thus, if the chamber 120 is maintained at 1 T then the cleaning apparatus 100 is able to operate at that pressure.

Various parts of the target delivery system 130 can be positioned outside the vessel 125, in a wall of the vessel 125 (as shown in FIG. 1A), or inside the chamber 120. The target delivery system 130 delivers, controls, and directs the targets 135 in the stream 132 toward the interacting region 140. The target 135 can be, for example, a droplet of liquid or molten metal, a portion of a liquid stream, solid particles or clusters, solid particles contained within liquid droplets, a form of target material, or solid particles contained within a portion of a liquid stream. The target 135 can be any material that emits EUV light 145 when in the plasma state. That is, the target 135 is a substance that, when in the plasma state, has an emission line in the EUV range. For example, the target 135 can include water, tin, lithium, and/or xenon. The target 135 can be a target mixture that includes the target matter 155 as well as impurities such as non-target particles (which do not contribute to the production of the EUV light 145). As an example, the target 135 can be the element tin, which can be used as pure tin (Sn); as a tin compound such as $SnBr_4$, $SnBr_2$, $SnH_4$; as a tin alloy, such as tin-gallium alloys, tin-indium alloys, tin-indium-gallium alloys; or any combination of these alloys. In the situation in which there are no impurities, the target 135 includes only the target matter 155.

A free radical (which can be at least one type of plasma particle 175 produced by the cleaning apparatus 100) is an atom, molecule, or ion that has an unpaired valence electron or an open electron shell, and therefore may be seen as having a dangling covalent bond. The dangling covalent bonds make free radicals highly chemically reactive, that is, a free radical can react readily with other substances. Because of their reactive nature, free radicals are used to remove a substance (such as the debris 105) from an object such as the exposed surface 110. The free radicals remove the debris 105 by, for example, etching, reacting with, and/or combusting the target matter 155 that forms the debris 105.

The plasma particles 175 (including the free radicals) can be created from the material 170 in any suitable manner. For example, the plasma particles 175 can be formed by breaking up the larger molecules of the material 170 that are near the non-electrically conductive body 165. Larger molecules are broken up by a process that puts enough energy into these larger molecules, such as ionizing radiation, heat, and electrical discharges that are caused by the operation of the electrical conductor 160. Specifically, the formation of the plasma particles 175 involves supplying enough energy to the larger molecules of material 170 to break a bond (generally a covalent bond) between the atoms of the larger molecules.

In some implementations, as discussed above, the target 135 includes tin (Sn), and in these implementations, the target matter 155 that forms the debris 105 includes tin particles (for example, tin or tin oxide). One of the materials 170 present and permitted within the chamber 120 is molecular hydrogen ($H_2$). In this case, the plasma particles 175 are produced from the molecular hydrogen. The plasma particles 175 can include free radicals and ions of hydrogen. One example of a simple free radical of hydrogen is a single hydrogen element with an unpaired valence electron (H*). The chemical process that transpires due to the operation of the cleaning apparatus 100 is represented by the following chemical formula:

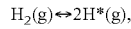

$$H_2(g) \leftrightarrow 2H^*(g),$$

where g indicates that the chemical is in the gaseous state.

The generated free radicals H* of the hydrogen bond with the tin particles in the debris 105 and form a new chemical 180, which is called tin hydride ($SnH_4$), which is then released from the exposed surface 110. This chemical process is represented by the following chemical formula:

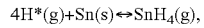

$$4H^*(g)+Sn(s) \leftrightarrow SnH_4(g),$$

where s indicates that the chemical is in the solid state.

In this way, the coating formed from the debris 105 is etched off or removed from the exposed surface 110 at a rate of at least 10 nanometers per min and as much as 200 nm/min over the entire exposed surface 110, and not just the regions that are proximate to the cleaning apparatus 100. This is because the plasma particles 175 are created as close as possible to the exposed surface 110, or close enough that fluid flows within the chamber 120 move the plasma particles 175 quickly across the exposed surface 110 before the plasma particles 175 recombine or revert back into the material 170. This is important because hydrogen radicals H* (and other free radicals) are short lived and tend to recombine to reform molecular hydrogen. The cleaning apparatus 100 is designed to enable the plasma particles 175 to have a chance to react with the target mater 155 of the debris 105 before these plasma particles 175 have a chance to recombine with each other to reform the material 170, and this permits the cleaning of the exposed surface 110 without having to remove the structure 115 from the chamber 120.

H* is not the only free radical or ion produced by the cleaning apparatus 100 from molecular hydrogen $H_2$. There are many other free radicals and ions that can be formed from molecular hydrogen $H_2$ due to the operation of the cleaning apparatus 100. These other free radicals and ions are plasma particles 175 as well. For example, Deuteron $H_2^+$ and Triton $H_3^+$ can also react with tin and form gaseous tin hydrides, although they are not dominant.

The electrical conductor 160 can be made of any suitable conducting material such as copper and copper alloys. The electrical conductor 160 is placed in proximity of (and contacting) the non-electrically conductive body 165 and thus the electrical conductor 160 should be appropriately sized so that it does not obstruct other components or elements of the chamber 120. The electrical conductor 160 can include a plurality of conductors placed so that they contact various parts of the body 165. The electrical conductor 160 can be wound or coiled so that it contacts a plurality of regions of the body 165. The electrical conductor 160 can extend in a manner so that it continuously contacts a large region of the body 165. These different designs are discussed below.

In some implementations, the electrical conductor 160 is in such proximity to the non-electrically conductive body 165 that there is a thermal coupling between the electrical conductor 160 and the non-electrically conductive body 165. The non-electrically conductive body 165 can have a high enough thermal conductivity to permit the efficient transfer of heat between the body 165 and the electrical conductor 160. This means that the temperature of non-electrically conductive body 165 is correlated with (and affected by) the temperature of the electrical conductor 160. The value of the thermal conductivity of the non-electrically conductive body 165 depends on the heat load applied to the body 165; thus, if the heat load is low, then the thermal conductivity may be lower compared with a situation in which the heat load on the body 165 is high. For example, the thermal conductivity of the non-electrically conductive body 165 can be about 70 watts/meter·Kelvin (W/m·K).

In these implementations, the cleaning apparatus also includes a temperature control system 190 thermally coupled to the electrical conductor 160. And, because the non-electrically conductive body 165 is thermally coupled to the electrical conductor 160, by controlling a temperature of the electrical conductor 160, it is also possible to control a temperature of the non-electrically conductive body 165. In further implementations, it is possible for the structure 115 to also be thermally coupled to one or more of the electrical conductor 160 and the non-electrically conductive body 165 (or the structure 115 and the non-electrically conductive body 165 are the same component, as discussed with reference to FIGS. 2A and 2B).

The temperature control system 190 can be configured to maintain a temperature of the non-electrically conductive body 165 and the structure 115, if the structure 115 is thermally coupled to the electrical conductor 160, below a threshold maximum value or within a threshold range of values. Thus, the temperature control system 190 can be used to cool the body 165 or both the body 165 and the structure 115. For example, the temperature control system 190 can be configured to cool the body 165 or both the body 165 and the structure 115 to a temperature below the melting point of the target matter 155. Thus, if the target matter 155 includes tin, then the temperature control system 190 is configured to cool the body 165 or both the body 165 and the structure 115 to below 50° C.

Though not required, it is possible to design the electrical conductor 160 as a tube extending along a longitudinal direction, such tube including hollow longitudinal opening 195, as shown in FIG. 1B. The hollow opening 195 can be used as a conduit or interior passage as follows. In this implementation, the temperature control system 190 includes a fluid control system that feeds or supplies a cooling fluid (such as water) through this interior passage 195 to thereby control the temperature of the electrical conductor 160. In this example, the cooling of the body 165 is limited by the freezing temperature of the cooling fluid that flows through the opening 195 and if the cooling fluid is water then the temperature of the water should be kept above the freezing temperature of water at the pressure in the opening 195.

The non-electrically conductive body 165 is not electrically conductive. Thus, the body 165 is made of a dielectric. For example, a suitable dielectric is a ceramic such as aluminum nitride, boron nitride, silicon carbide, aluminum oxide, boron carbide, and other composite ceramics. In other implementations, the dielectric can be glass, porcelain, mica, polyethylene, quartz, or sapphire.

Referring again to FIG. 1A, the cleaning apparatus 100 can be coupled to a power source 191 configured to supply current to the electrical conductor 160. The current that is supplied to the electrical conductor 160 can be in the radio frequency (RF) range. Radio frequencies are electromagnetic wave frequencies that lie in the range extending from around 20 kilohertz (kHz) to 300 gigahertz (GHz).

In one implementation, the electric power supplied to the electrical conductor 160 can be on the order of several or tens of kilowatts (kW). The electrical conductor 160 is a hallow tube made of copper having a diameter of less than ½", with 1 gallon per minute of cooling water flowing through its interior passage 195. The RF frequency can be about 14 mHz and the electric power supplied to the electrical conductor 160 can be about 1-3 kW. The chamber 120 can be held at about 140 pascals (Pa), which is about 1.05 T. The rate of removal of the debris 105 from the surface 110 can be at least 200 nanometers (nm)/minute across the entire surface 110.

In other implementations, the electrical conductor 160 can be implemented as a part of a microwave plasma generator. For example, the current that is supplied to the electrical conductor 160 is in a range that produces microwave radiation. Microwave radiation is an electromagnetic wave having frequencies that lie in the range extending from around 1 GHz to around 300 GHz. In such implementations, the electric current that is induced at the location 161 can be along the surface of the structure 115, and can be considered a surface wave.

Additionally, a control apparatus 192 can communicate with the cleaning apparatus 100 and the power source 191 to thereby control the operation of the electrical conductor 160. The control apparatus 192 can also communicate with and control operation of the temperature control system 190.

For example, the control apparatus 192 can send a signal to the power source 191 to provide current to the electrical conductor 160 and at the same time send a signal to the temperature control system 190 to activate the temperature control of the body 165 or the structure 115. The control apparatus 192 can include one or more modules. The various modules of the control apparatus 192 can be free-standing modules in that data between the modules is not transferred from module to module. Or, one or more of the modules within the control apparatus 192 can communicate with each other. The modules within the control apparatus 192 can be co-located or separated from each other physically.

The control apparatus 192 can include memory, which can be read-only memory and/or random access memory. Storage devices suitable for tangibly embodying computer program instructions and data include all forms of non-volatile memory, including, by way of example, semiconductor memory devices, such as EPROM, EEPROM, and flash memory devices; magnetic disks such as internal hard disks and removable disks; magneto-optical disks; and CD-ROM disks. The control apparatus 192 can also include one or more input devices (such as a keyboard, touch screen, microphone, mouse, hand-held input device, etc.) and one or more output devices (such as a speaker or a monitor).

The control apparatus 192 includes one or more programmable processors, and one or more computer program products tangibly embodied in a machine-readable storage device for execution by a programmable processor. The one or more programmable processors can each execute a program of instructions to perform desired functions by operating on input data and generating appropriate output. Generally, the processor receives instructions and data from memory. Any of the foregoing may be supplemented by, or incorporated in, specially designed ASICs (application-specific integrated circuits).

Each of the modules within the control apparatus 192 can be a set of computer program products executed by one or more processors. Moreover, any of the modules can access data stored within the memory. Connections between controllers/features/modules within the control apparatus 192 and between controllers/features/modules within the control apparatus 192 and components the cleaning apparatus 100 can be wired or wireless.

Referring to FIG. 2A, in some implementations, the non-electrically conductive body 165 is a non-electrically conductive body 265 that is distinct from the structure 215 having the exposed surface 210. In these implementations, the structure 215 and the non-electrically conductive body 265 can be configured to be in proximity of each other or adjacent to each other. Or, the structure 215 and the body 265 can be two parts of a larger object (for example, the structure 215 is the region that includes the exposed surface 210 while the body 265 is remote from the region). The electrical conductor 260 is in contact with the non-electrically conductive body 265.

Figure 10A:
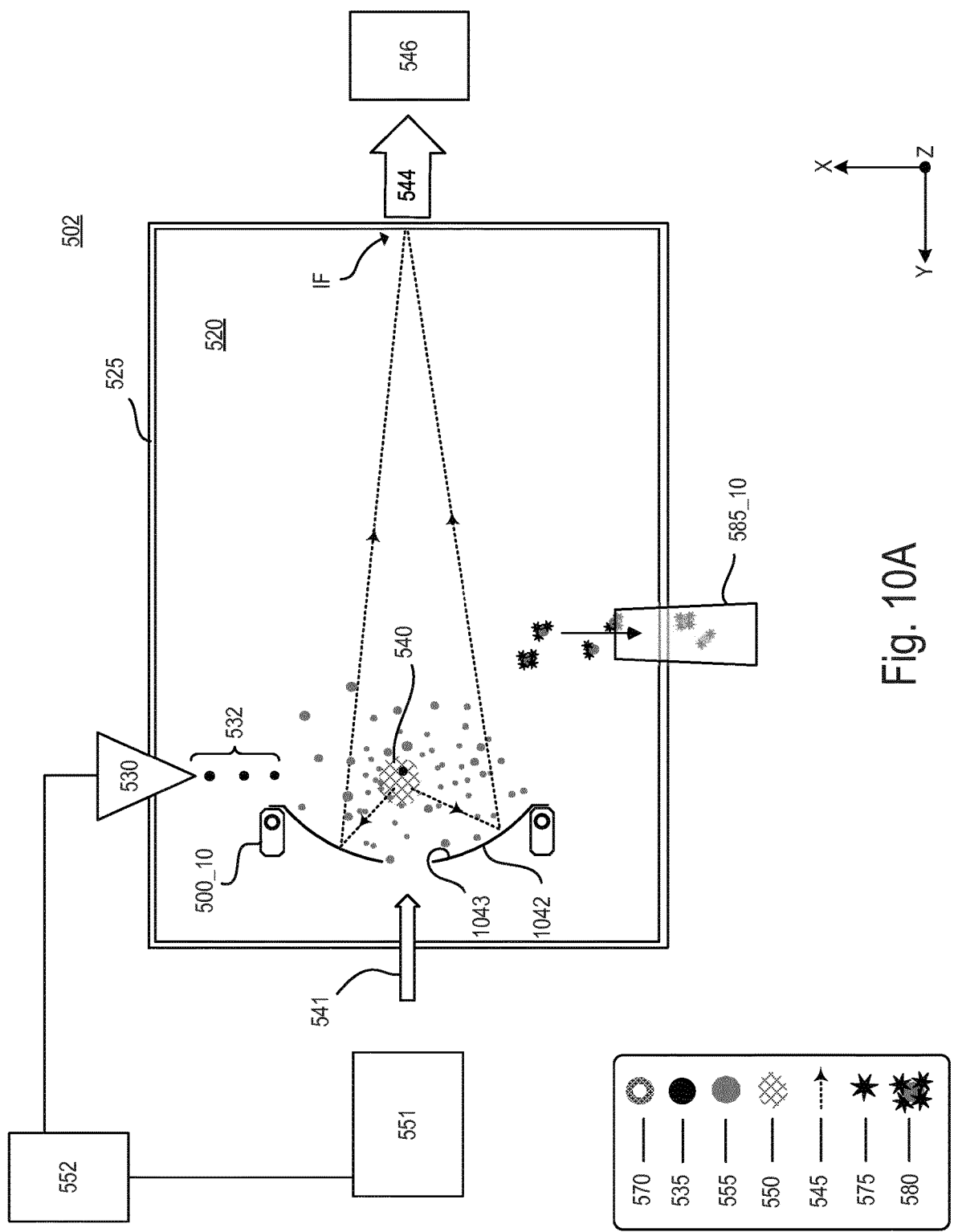
FIG. 10A is a block diagram of an EUV light source in which the cleaning apparatus is implemented to clean an optical collector.
Figure 10B:
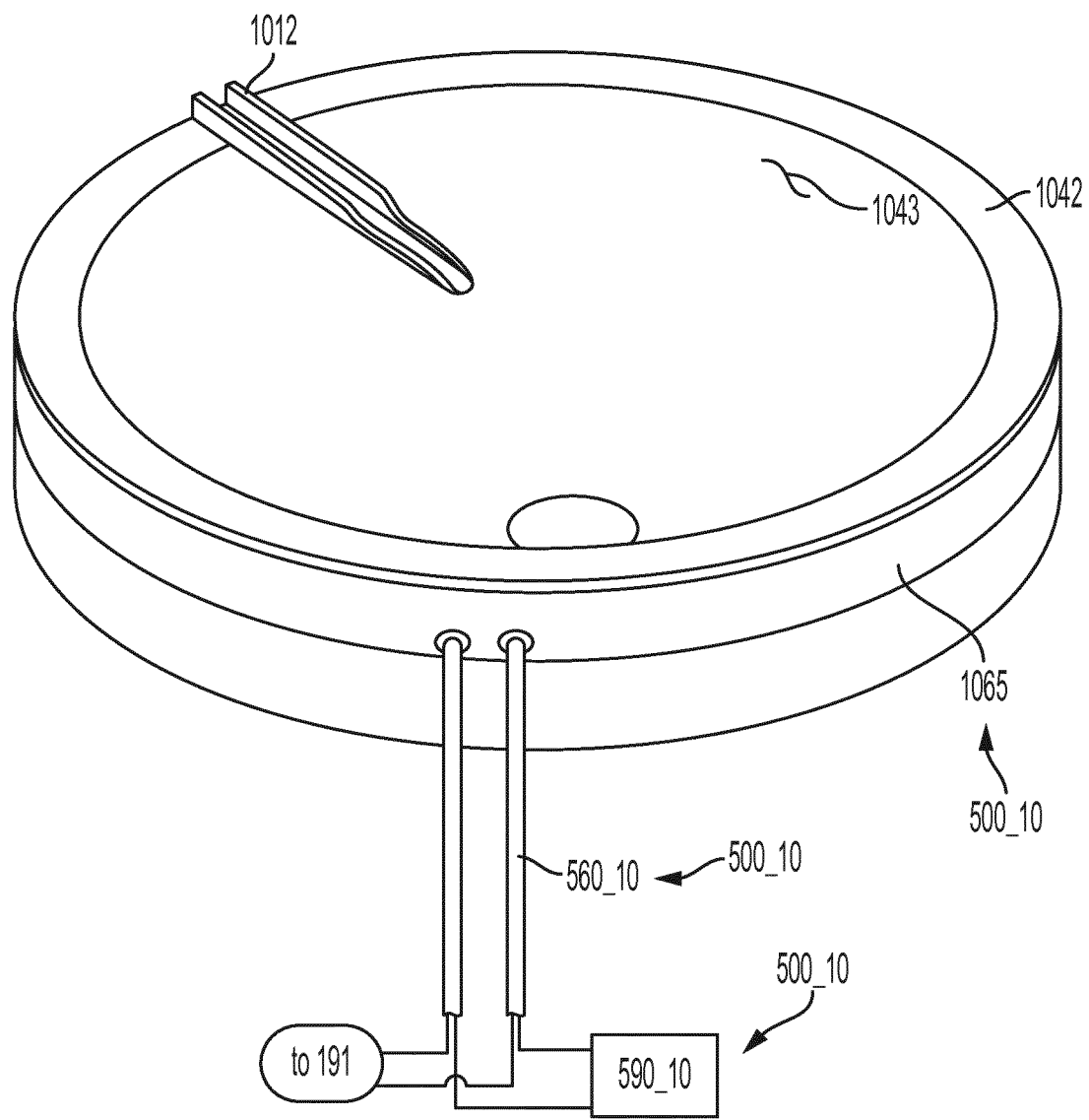
FIG. 10B is a perspective view of the cleaning apparatus of FIG. 10A.
Figure 10D:
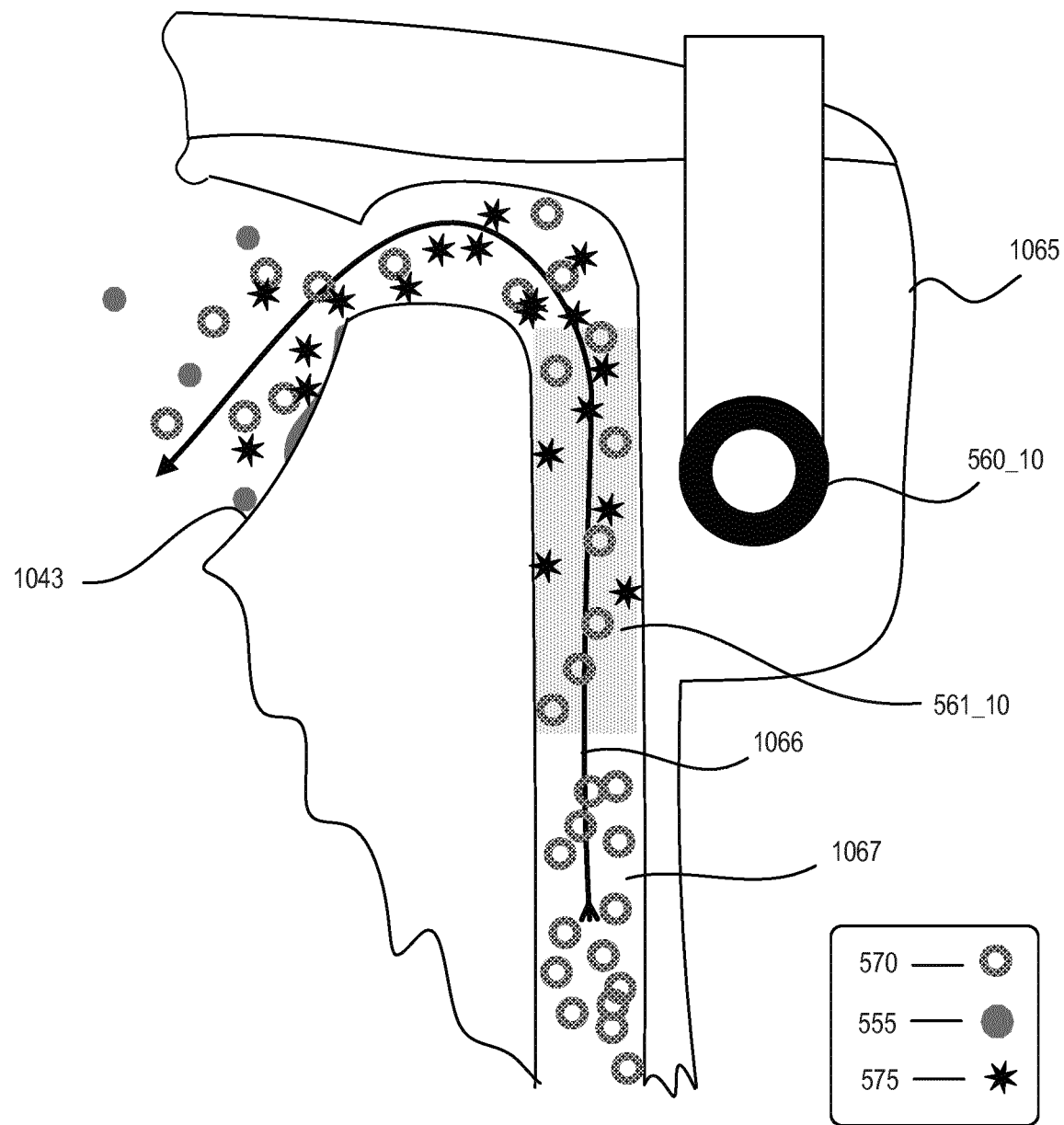
FIG. 10D is a close-up side cross-sectional view of the portion of the cleaning apparatus of FIG. 10C.

As shown in FIG. 2B, in these implementations, the plasma particles 175 are created near the body 265A when the electrical conductor 260B electromagnetically induces an electric current at the location 261B adjacent the non-electrically conductive body 265B. In these implementations, the body 265B is configured relative to the structure 215B to enable the plasma particles 175 to come in contact with the debris 105 on the exposed surface 210B. For example, as shown in FIG. 2B, the body 265B can be physically positioned so that the plasma particles 175 that are created at the location 261B are swept or pushed from the body 265B toward the exposed surface 210B. In this example, there exists a fluid flow pattern 266 within the chamber 120 that provides the forces needed to sweep or push the plasma particles 175 toward the exposed surface 210B in a swift manner and before the plasma particles 175 have a chance to recombine and revert back into the target matter 155. The fluid flow pattern 266 can be a fluid flow of the material 170 across the exposed surface 210B to protect the exposed surface 210B during operation. The fluid flow pattern 266 is a flow need to carry the plasma particles 175 to the debris contaminated surface 110 or surfaces. Moreover, the fluid flow pattern 266 also can provide the flow needed to carry the new material 180 (such as the tin hydride) from the surfaces 110 to the removal apparatus 185. Another type of fluid flow pattern 266 is shown in FIGS. 10C and 10D. The fluid flow pattern 266 is a perimeter flow pattern 1066, which is an existing flow pattern that is configured to protect the reflective surface 1043 of the optical collector 1042.

In other implementations, such as those in which the exposed surface 210C is in the proximity of the body 265C, and is also in the proximity of the location 261C at which the plasma particles 175 are produced, as shown in FIG. 2C, the fluid flow pattern 266 may not be required in order to ensure that the plasma particles 175 reach the exposed surface 210C. Specifically, the exposed surface 210C is so proximate to the body 265C that the location 261C at which the plasma particles 175 are produced coincides with the exposed surface 210C.

Figure 3B:
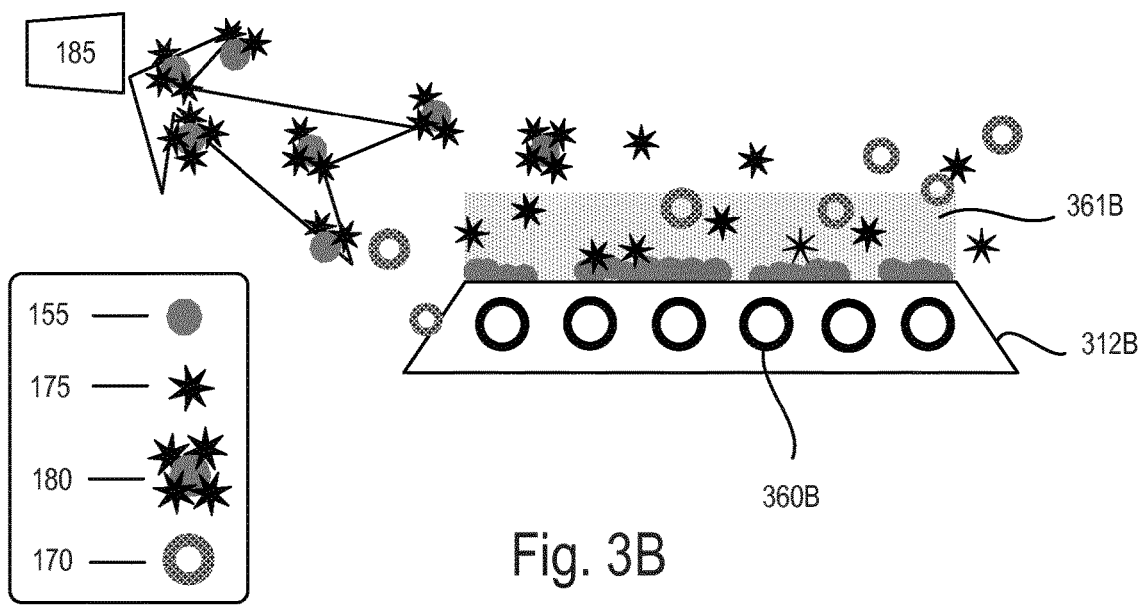

Referring to FIG. 3A, in other implementations, the non-electrically conductive body 165 is the structure 110. Thus, the structure 110 and the non-electrically conductive body 165 are one and the same structure 312. In these implementations, the electrical conductor 160 is directly coupled with the structure 312. That is, the electrical conductor 160 makes contact with at least some portion or region of the structure 312. Moreover, the structure 312 has all of the properties of the non-electrically conductive body 165, which means that the structure 312 is not electrically conductive and can be made of a dielectric such as ceramic. For example, as shown in FIG. 3B, the electrical conductor 360B is placed adjacent to (or embedded within as shown in FIG. 3B) the structure 312B such that the electrical conductor 360B is configured to electromagnetically induce an electric current at the location 361B adjacent the structure 312B to transform the material 170 present into the plasma particles 175. Because the plasma particles 175 are created at the structure 312B there is no need for any fluid flow pattern 266 to transport the plasma particles 175.

As discussed above, the electrical conductor 160 contacts the non-electrically conductive body 165. With reference to FIGS. 4A-4D, the electrical conductor 160 can contact the non-electrically conductive body 165 in different manners, depending on the geometry of the body 165 and also depending on the relative pressure between two surfaces of the body 165. The body 165 needs to be made of a dielectric in order for the electric current to be induced at the location 161 due to the electric current flowing through the electrical conductor 160. Moreover, while the below examples discuss the body 165, it is noted that in each of these examples, the body 165 can also be the structure 110. Each of these examples are discussed next.

Figure 4A:
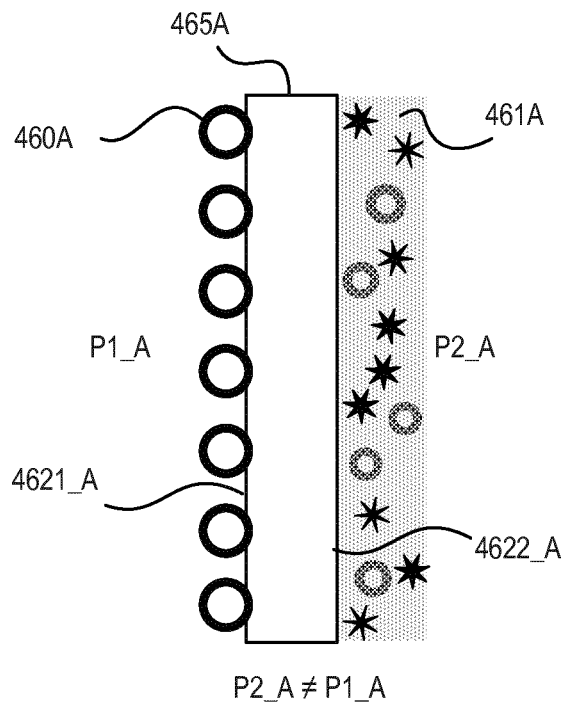
FIG. 4A is a schematic diagram showing an implementation of the cleaning apparatus in which the electrical conductor is partly exposed and contacts the body at a plurality of locations at an exposed surface of the body.

As shown in FIG. 4A, the electrical conductor 460A contacts the body 465A at a plurality of locations on a first surface 4621_A that is held at a first pressure P1_A. A second surface 4622_A (which is adjacent to the location 461A at which the electric current is induced) is held at a second pressure P2_A. In this example, the second pressure P2_A is distinct from the first pressure P1_A. For example, the second pressure P2_A can be a vacuum pressure while the first pressure P1_A can be atmospheric pressure. In this case, at least part of the electrical conductor 460A is exposed to the first pressure P1_A. It is safe to expose the electrical conductor 460A to atmospheric pressure (to reduce costs and design steps) because at these pressures, the plasma particles 175 produced by the cleaning apparatus 100 are not ignited and there is little chance to damage the electrical conductor 460A.

Figure 4B:
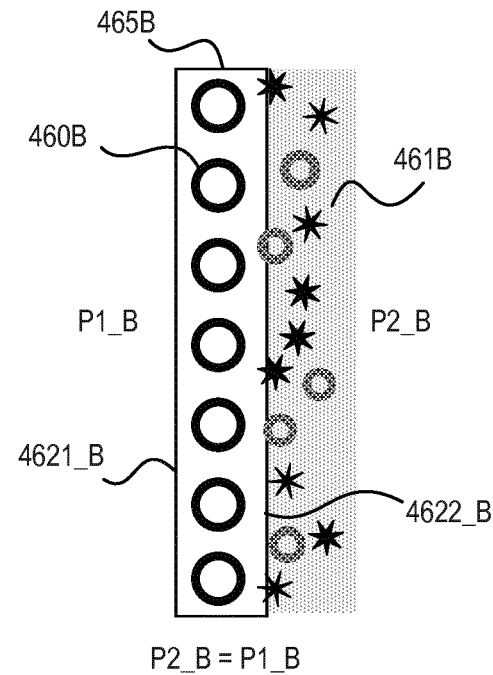
FIG. 4B is a schematic diagram showing an implementation of the cleaning apparatus in which the electrical conductor is embedded within the body at a plurality of locations.

As shown in FIG. 4B, the electrical conductor 460B contacts the body 465B at a plurality of locations. Moreover, a first surface 4621_B is held at a first pressure P1_B. A second surface 4622_B (which is adjacent to the location 461B at which the electric current is induced) is held at a second pressure P2_B. In this example, the second pressure P2_B is the same as the first pressure P1_B. For example, both the second pressure P2_B and the first pressure P2_B can be a vacuum pressure. In this case, the entire electrical conductor 460B is embedded within the body 465B so that the conductor 460B is not exposed to the first pressure P1_B. In this example, because the pressure P1_B is at a vacuum pressure, there is a chance that the plasma particles 175 will be ignited and cause damage an exposed electrical conductor 460B. Thus, in this case, the electrical conductor 460B is shielded from the plasma attack by being embedded in the body 465B, which is a non-electrically conductive material such as a dielectric.

Figure 4C:
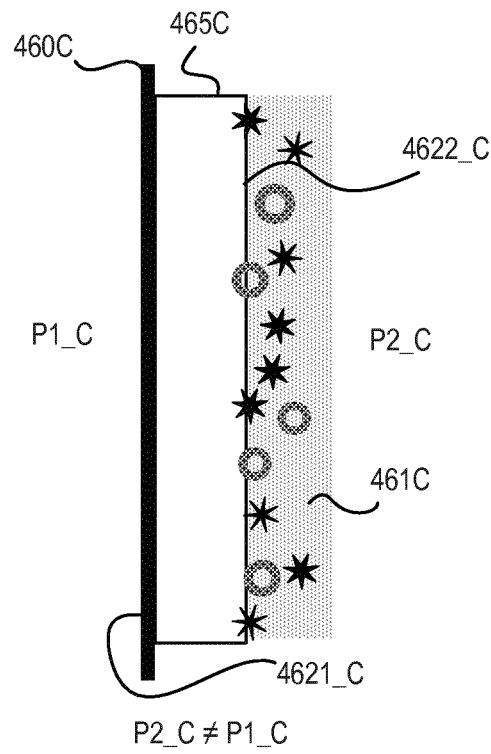
FIG. 4C is a schematic diagram showing an implementation of the cleaning apparatus in which the electrical conductor is partly exposed and contacts the body over a continuous spatial area of an exposed surface of the body.

As shown in FIG. 4C, the electrical conductor 460C contacts the body 465C over a continuous spatial area at a first surface 4621_C, which is held at a first pressure P1_C. A second surface 4622_C (which is adjacent to the location 461C at which the electric current is induced) is held at a second pressure P2_C. In this example, the second pressure P2_C is distinct from the first pressure P1_C. For example, the second pressure P2_C can be a vacuum pressure while the first pressure P1_C can be atmospheric pressure. In this case, the electrical conductor 460C is exposed to the first pressure P1_C.

Figure 4D:
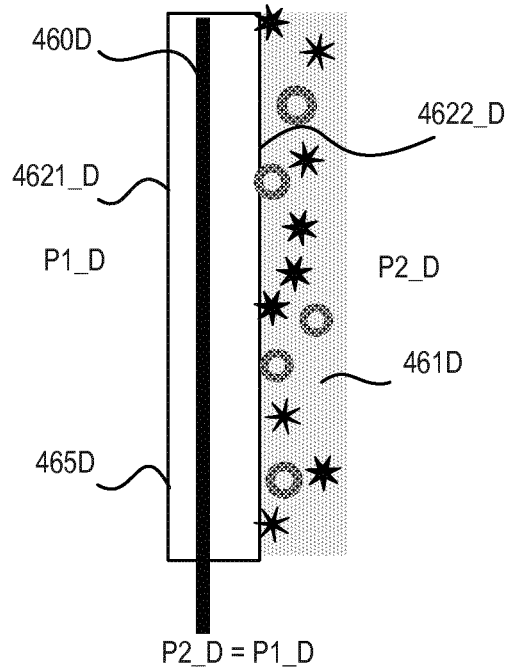
FIG. 4D is a schematic diagram showing an implementation of the cleaning apparatus in which the electrical conductor is embedded within the body and contacts the body continuously.

As shown in FIG. 4D, the electrical conductor 460D contacts the body 465C continuously. Moreover, a first surface 4621_D is held at a first pressure P1_D. A second surface 4622_D (which is adjacent to the location 461D at which the electric current is induced) is held at a second pressure P2_D. In this example, the second pressure P2_D is the same as the first pressure P1_D. For example, both the second pressure P2_D and the first pressure P2_D can be a vacuum pressure. In this case, the entire electrical conductor 460D is embedded within the body 465D so that the conductor 460D is not exposed to the first pressure P1_D.

Figure 5:
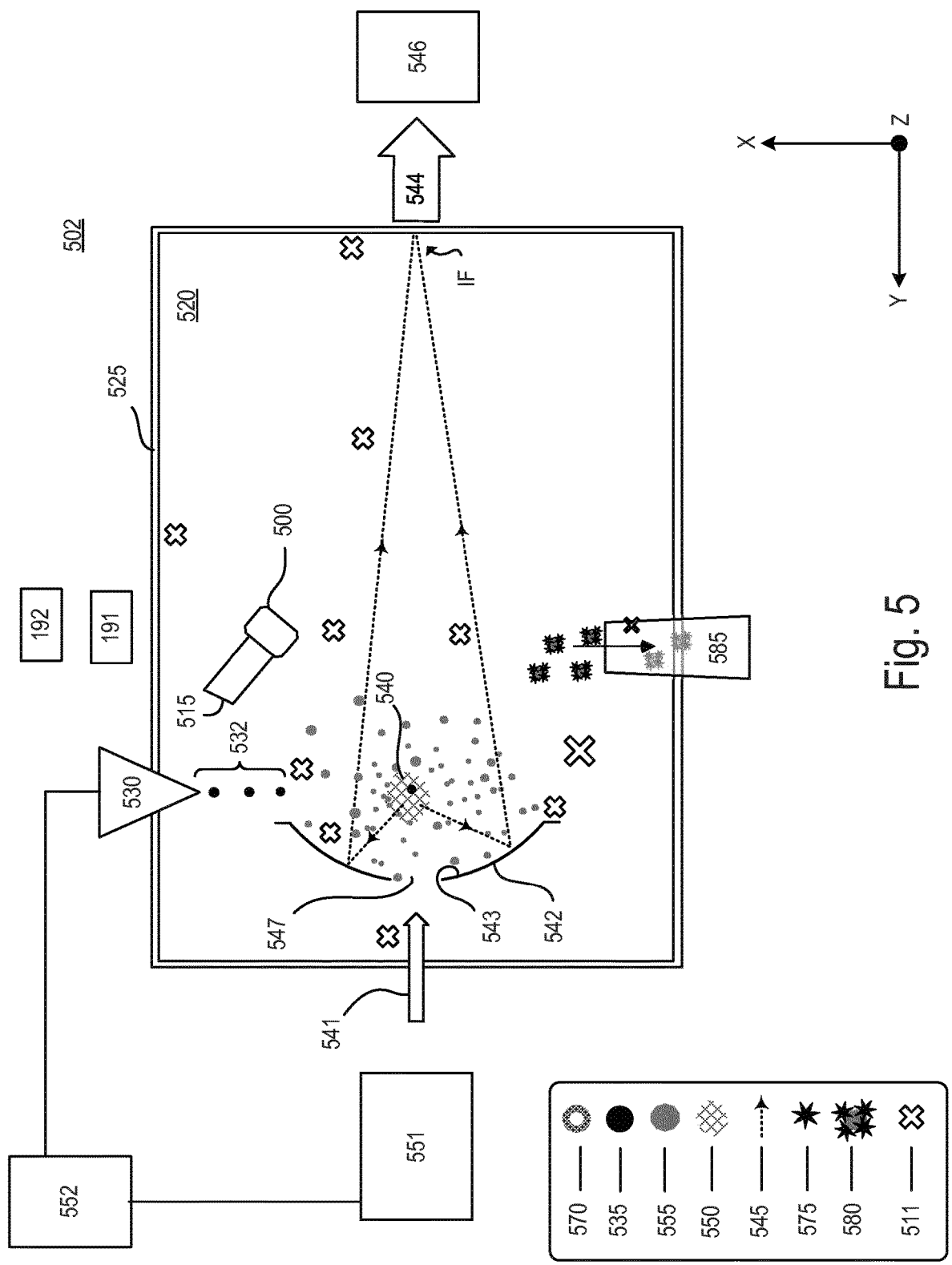
FIG. 5 is a block diagram of an EUV light source in which the cleaning apparatus is implemented.
Figure 6A:
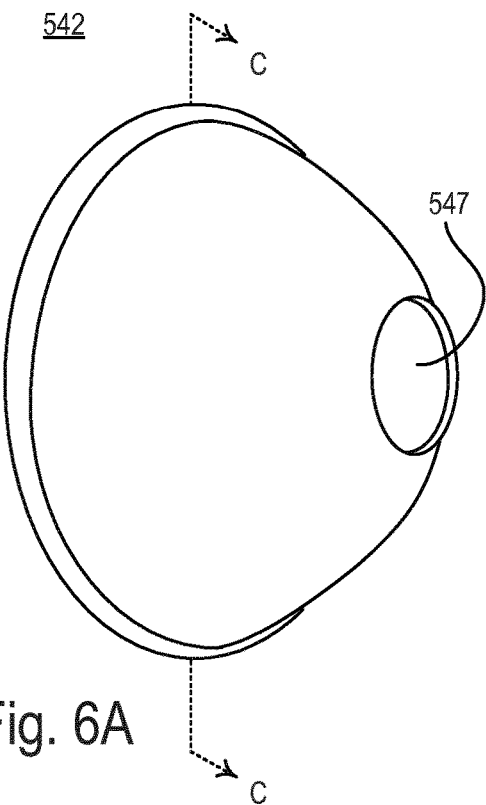
FIGS. 6A-6D show back perspective, front perspective, side cross-sectional, and front plan views of an exemplary optical collector that can be cleaned by the cleaning apparatus of FIG. 5.
Figure 6B:
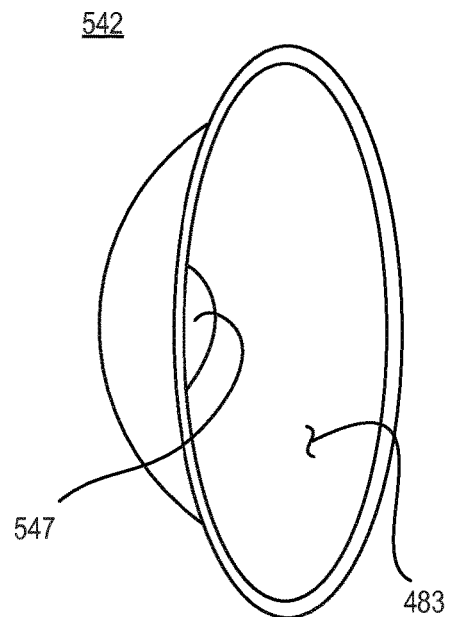
Figure 6C:
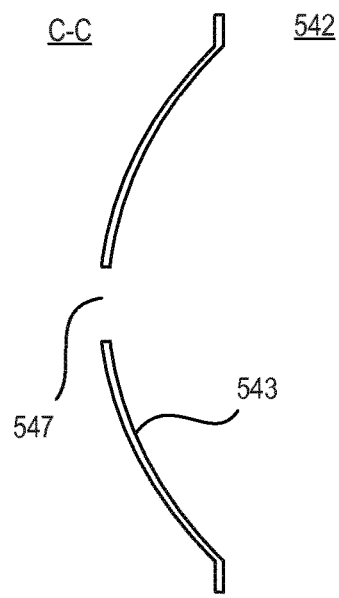
Figure 6D:
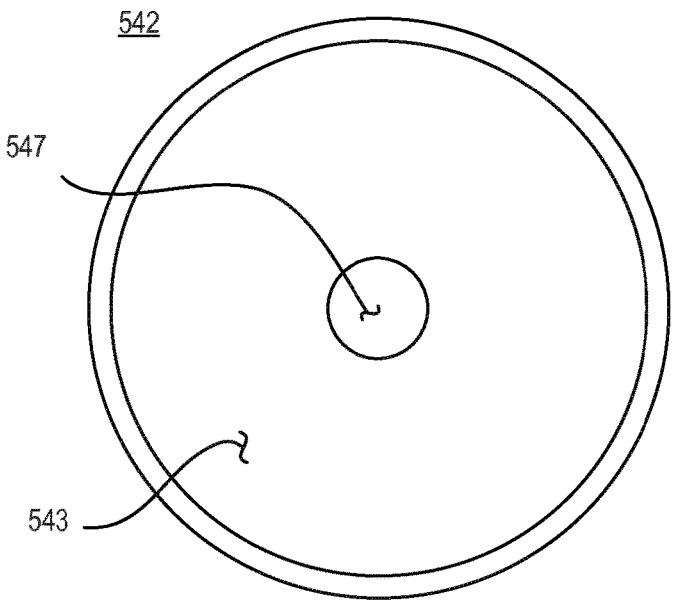
Figure 7A:
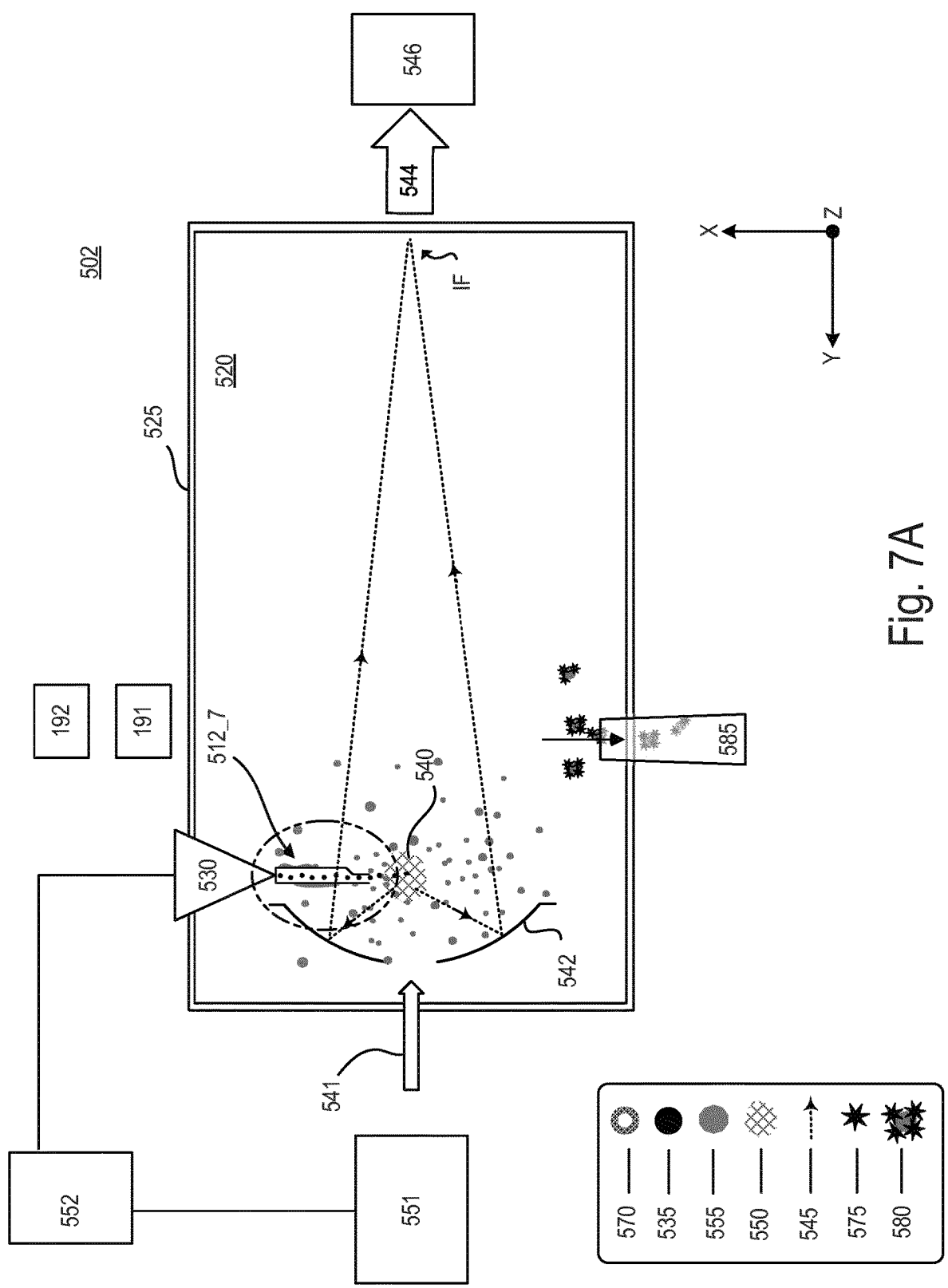
FIG. 7A is a block diagram of an EUV light source in which the cleaning apparatus is implemented to clean a shroud that is placed between a target delivery system and an interacting region.

Referring to FIG. 5, the cleaning apparatus 500 is shown in an implementation of an EUV light source 502. In this implementation, the cleaning apparatus 500 is shown adjacent a structure 515 to thereby clean an exposed surface of the structure. Other components of the EUV light source 502 are discussed next. The EUV light source 502 includes the target delivery system 530 that directs the stream 532 of targets 535 toward the interacting region 540 in the chamber 520. The interacting region 540 receives an amplified light beam 541, which can be a train of amplified light pulses. As discussed above, the target 535 includes matter that emits EUV light 545 when it is converted into the light-emitting plasma 550. An interaction between the matter within the target 535 and the amplified light beam 541 at the interacting region 540 converts at least some of the matter in the target 535 into the light-emitting plasma 550, and that light-emitting plasma 550 emits the EUV light 545. The light-emitting plasma 550 has an element with an emission line in the EUV wavelength range. The light-emitting plasma 550 has certain characteristics that depend on the composition of the target 535. These characteristics include the wavelength of the EUV light 545 produced by the light-emitting plasma 550.

The light-emitting plasma 550 can be considered to be a highly ionized plasma with electron temperatures of several tens of electron volts (eV). To be clear, the light-emitting plasma 150, 550 produced from the target 135, 535 is distinct from the plasma particles 175 that are in the plasma state of the material 170, as follows. The light-emitting plasma 150, 550 is produced due to the interaction between the target 135, 535 and the amplified light beam 541. Moreover, the light-emitting plasma 150, 550 of the target 135, 535 is what produces the EUV light 145, 545. By contrast, the plasma particles 175 are created from the material 170 that is found inside the chamber 120, 520. Neither the material 170 nor the plasma particles 175 contributes to the production of the EUV light 145, 545. Moreover, the plasma particles 175 are not produced from any interaction of the material 170 with the amplified light beam 541.

Higher energy EUV light 545 can be generated with fuel materials (the target 535) other than tin such as, for example, terbium (Tb) and gadolinium (Gd). The energetic radiation (the EUV light 545) generated during de-excitation and recombination of the ions is emitted from the light-emitting plasma 550, and at least a portion of this EUV light 545 is collected by an optical element 542. The optical element 542 can be an optical collector in which a surface 543 interacts with at least a portion of the emitted EUV light 545. The surface 543 of the optical element 542 can be a reflective surface that is positions to receive the portion of the emitting EUV light 545 and to direct this collected EUV light 544 for use outside the EUV light source 502. The reflective surface 543 directs the collected EUV light 544 to a secondary focal plane, where the EUV light 544 is then captured for use by a tool 546 (such as a lithography apparatus) outside the EUV light source 502. Exemplary lithography apparatuses are discussed with reference to FIGS. 14 and 15.

The reflective surface 543 is configured to reflect light in the EUV wavelength range and can absorb, diffuse, or block light outside the EUV wavelength range. The optical collector 542 also includes an aperture 547 that permits the amplified light beam 541 to pass through the optical collector 542 toward the interacting region 540.

As shown in FIGS. 6A-6D, the optical collector 542 can be, for example, an ellipsoidal mirror that has a primary focus at the interacting region 540 and a secondary or intermediate focus IF at the secondary focal plane. This means that a plane section (such as plane section C-C) is in the shape of an ellipses or a circle. Thus, the plane section C-C cuts through the reflective surface 543, and it is formed from a portion of an ellipse. A plan view of the optical collector 542 (FIG. 6D) shows that the edge of the reflective surface 543 forms a circular shape.

Referring again to FIG. 5, the EUV light source 502 includes an optical system 551 that produces the amplified light beam 541 due to a population inversion within a gain medium or mediums of the optical system 551. The optical system 551 can include at least one optical source that produces a light beam, and a beam delivery system that steers and modifies the light beam and also focuses the light beam to the interacting region 540. The optical source within the optical system 551 includes one or more optical amplifiers, lasers, and/or lamps for providing one or more main pulses that form the amplified light beam 541. And, in some cases, the optical system 551 can also provide one or more pre-pulses that form a precursor amplifier light beam (not shown) that interacts with the target 535 prior to the interaction between the amplified light beam 541 and the target 535. Each optical amplifier includes a gain medium capable of optically amplifying the desired wavelength at a high gain, an excitation source, and internal optics. The optical amplifier may or may not have laser mirrors or other feedback devices that form a laser cavity. Thus, the optical system 551 produces the amplified light beam 541 due to population inversion in the gain media of the amplifiers even if there is no laser cavity. Moreover, the optical system 551 can produce the amplified light beam 541 that is a coherent laser beam if there is a laser cavity to provide enough feedback to the optical system 551. The term "amplified light beam" therefore encompasses one or more of: light from the optical system 551 that is merely amplified but not necessarily a coherent laser oscillation and light from the optical system 551 that is amplified and also a coherent laser oscillation.

The optical amplifiers used in the optical system 551 can include as a gain medium a gas that includes carbon dioxide ($CO_2$) and can amplify light at a wavelength of between about 9100 and 11000 nanometers (nm), and for example, at about 10600 nm, at a gain greater than or equal to 100. Suitable amplifiers and lasers for use in the optical system 551 include a pulsed laser device, for example, a pulsed gas-discharge $CO_2$ laser device producing radiation at about 9300 nm or about 10600 nm, for example, with DC or RF excitation, operating at relatively high power, for example, 10 kW or higher and a high pulse repetition rate, for example, 40 kHz or more.

The EUV light source 502 also includes a control apparatus 552 in communication with one or more controllable components or systems of the EUV light source 502. The control apparatus 552 is in communication with the optical system 551 and the target delivery system 530. Moreover, the control apparatus 552 can include or can communicate with the control apparatus 192 that operates the power source 191 that supplies the power to the cleaning apparatus 500. The target delivery system 530 can be operable in response to signals from one or more modules within the control apparatus 552. For example, the control apparatus 552 can send a signal to the target delivery system 530 to modify the release point of the targets 535 to correct for errors in the targets 535 arriving at the interacting region 540. The optical system 551 can be operable in response to signal from one or more modules within the control apparatus 552. The various modules of the control apparatus 552 can be free-standing modules in that data between the modules is not transferred from module to module. Or, one or more of the modules within the control apparatus 552 can communicate with each other.

One or more of the modules within the control apparatus 552 can be co-located with each other. Or, one or more of the modules within the control apparatus 552 can be separated from each other physically. For example, the module that controls the target delivery system 530 can be co-located with the target delivery system 530 while a module that controls the optical system 551 can be co-located with the optical system 551.

The EUV system 502 also includes the removal or exhaust apparatus 585 configured to remove the released chemical 580 from the EUV chamber 520 as well as other gaseous byproducts that can form within the EUV chamber 520. As discussed above, the released chemical 580 is formed from the interaction of the plasma particles 575 (produced from the material 570) with the target matter 555 that has deposited on the exposed surface of the structure 515. The removal apparatus 585 can be a pump that removes the released chemical 580 from the EUV chamber 520. The removal apparatus 585 can include a gas port that is in fluid communication with the EUV chamber 520 such that the released new chemical 580 is transported from the region near the structure 515 toward and through the gas port and out of the EUV chamber 520. For example, ones the new chemical 580 is formed, it is released from the exposed surface of the structure 515 and because the new chemical 580 is volatile, it is sucked to the removal apparatus 585, which removes the new chemical 580 from the EUV chamber 520.

Other components of the EUV light source 502 that are not shown, include, for example, detectors for measuring parameters associated with the produced EUV light 545. Detectors can be used to measure energy or energy distribution of the amplified light beam 541. Detectors can be used to measure an angular distribution of the intensity of the EUV light 545. Detectors can measure errors in the timing or focus of the pulses of the amplified light beam 541. Output from these detectors is provided to the control apparatus 552, which includes modules that analyze the output and adjust aspects of other components of the EUV light source 502 such as the optical system 551 and the target delivery system 530.

In summary, an amplified light beam 541 is produced by the optical system 551 and directed along a beam path to irradiate the target 535 at the interacting region 540 to convert the material within the target 535 into the plasma 550 that emits light in the EUV wavelength range. The amplified light beam 541 operates at a particular wavelength (the source wavelength) that is determined based on the design and properties of the optical system 551 as well as the properties of the target 535.

While only one cleaning apparatus 500 is explicitly shown in the EUV chamber 520 of FIG. 5, it is possible to configure a plurality of cleaning apparatuses 500 throughout the EUV chamber 520. Other possible and exemplary (but not limiting) locations for the cleaning apparatus 500 are marked by the cross icons 511 shown in FIG. 5. For example, the cleaning apparatus 500 can be positioned next to any element that includes a surface that could potentially interact with the target matter 555 and thus potentially become coated with the debris during operation of the EUV light source 502. Thus, one or more cleaning apparatuses 500 can be positioned next to the optical collector 542; next to any wall within the EUV chamber 520; or next to the target delivery system 530 or along the path between the target delivery system 530 and the interacting region 540. One or more cleaning apparatuses 500 can be positioned near the removal apparatus 585 to clean a surface of the port of the removal apparatus 585. In various implementations, therefore, additional electrical conductors 160 can be deployed to induce electric current at a location adjacent one or more surfaces of the removal apparatus 585.

Various implementations of the cleaning apparatus 500 and its uses are discussed next.

Referring to FIGS. 7A-7E, a cleaning apparatus 500_7 (not visible in FIG. 7A, but shown in FIGS. 7B-7E) is configured similarly to the cleaning apparatus 100 shown in FIGS. 3A and 3B because the structure with the exposed surface is the same as the non-electrically conductive body. The cleaning apparatus 500_7 includes a shroud 512_7 that is placed between the target delivery system 530 and the interacting region 540. The shroud 512_7 can be considered as a solid (generally lacking an internal cavity) and rigid body that provides a semi-protected or fully-protected passageway 701 for targets 535 as they travel from the target delivery system 530 toward the interacting region 540. The shroud 512_7 is configured to reduce the effect of turbulent flow within the chamber 520 on the targets 535 as they travel the path to the interacting region 540. The shroud 512_7 is positioned to extend across the optical collector 542 and is so close to the interacting region 540 that the shroud 512_7 is susceptible to being exposed to target matter 555 that is produced at the interacting region 540 and thus debris 505_7 from the target matter 555 forms on surfaces of the shroud 512_7. Thus, the cleaning apparatus 500_7 is designed to clean the surfaces of the shroud 512_7.

In this case, the shroud 512_7 is the structure with exposed surfaces to provide a semi-protected passageway 701. The shroud 512_7 is also the non-electrically conductive body and thus the shroud 512_7 acts as a self-cleaning device. Thus, the shroud 512_7 is made of a non-electrically conductive material. For example, the shroud 512_7 can be made of a dielectric, such as ceramic. Moreover, the cleaning apparatus 500_7 includes an electrical conductor 560_7 that extends through the body of the shroud 512_7. The electrical conductor 560_7 electromagnetically induces the electric current at the location 561_7 (similar to the location 361B) adjacent to all of the exterior surfaces of the shroud 512_7.

Because all of the exterior surfaces of the shroud 512_7 are maintained at the same pressure, which is the pressure within the chamber 520_7, the electrical conductor 560_7 is directed through the body of the shroud 512_7 so that it is embedded within the shroud 512_7 similar to the generic design shown in FIG. 4D. Moreover, the region between the electrical conductor 560_7 and any exterior surface of the shroud 512_7 is a solid region that lacks a cavity.

The cleaning apparatus 500_7 can also include a temperature control system 590_7 configured to control a temperature of the electrical conductor 560_7 and therefore also control the temperature of the shroud 512_7. The temperature control system 590_7 can be a cooling fluid (such as water) that is flowed adjacent a surface of the electrical conductor 560_7. For example, the electrical conductor 560_7 can be designed as a hollow tube, through which the cooling fluid can be flowed to cool the electrical conductor 560_7 and therefore also cool the shroud 512_7.

As shown in FIG. 7D, the shroud 512_7 can be made of two solid pieces 712A, 712B that are complementarily shaped and each include a complementary recess 713A, 713B. The recess 713A in the solid piece 712A is formed on the side of the solid piece 712A facing the solid piece 712B and the recess 713B in the solid piece 712B is formed on the side of the solid piece 712B facing the solid piece 712A. Thus, when the solid pieces 712A, 712B are placed together, the recesses 713A, 713B form an opening that is sized to receive the electrical conductor 560_7. The electrical conductor 560_7 is therefore sandwiched between the recesses 713A, 713B and the solid pieces 712A, 712B can be bonded together. The electrical conductor 560_7 can be made of an electrically conductive material such as copper or copper alloy. The solid pieces 712A, 712B of the shroud 512_7 are made of a dielectric (such as a ceramic) that has a thermal conductivity sufficient to permit the efficient heat transfer from the shroud 512_7 to the cooling fluid that flows through the electrical conductor 560_7. One example of a suitable ceramic that can be used in the solid pieces 712A, 712B is boron nitride but it may be possible to use aluminum nitride.

In the design of FIGS. 7A-7E, the cleaning apparatus 500_7 is integrated within the structure having the surface to be cleaned (similarly to the design of FIGS. 3A and 3B). In this way, the structure itself becomes the conduit that enables the electromagnetic induction of the electric current at the location 561_7 due to the flow of the current through the electrical conductor 560_7.

In other implementations, it is possible to design the cleaning apparatus 500_7 separately or remotely from the shroud 512_7 (similarly to the design of FIGS. 2A and 2B). Thus, the cleaning apparatus 500_7 could be configured to induce an electric current at a location adjacent a non-electrically conductive body (such as body 265B) and then a fluid flow pattern 266 can be provided or used to push the created plasma particles 175 across the surfaces or surface of the shroud 512_7.

Figure 8A:
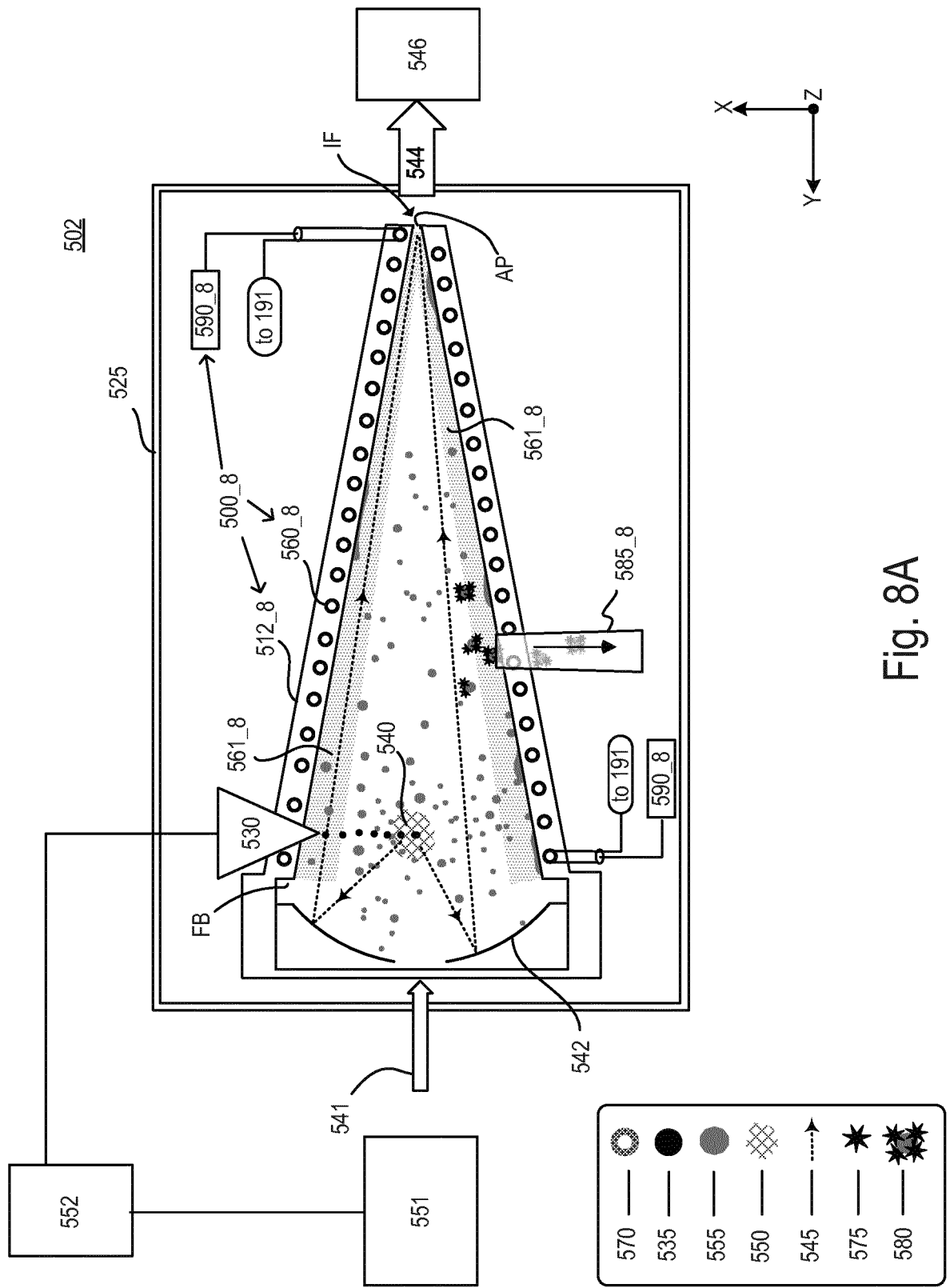
FIG. 8A is a block diagram of an EUV light source in which the cleaning apparatus is implemented as a liner or sub-vessel that is placed between an optical collector and an intermediate focus of the optical collector, in which the electrical conductor is embedded within the liner body, and the liner body has a conical shape.
Figure 8B:
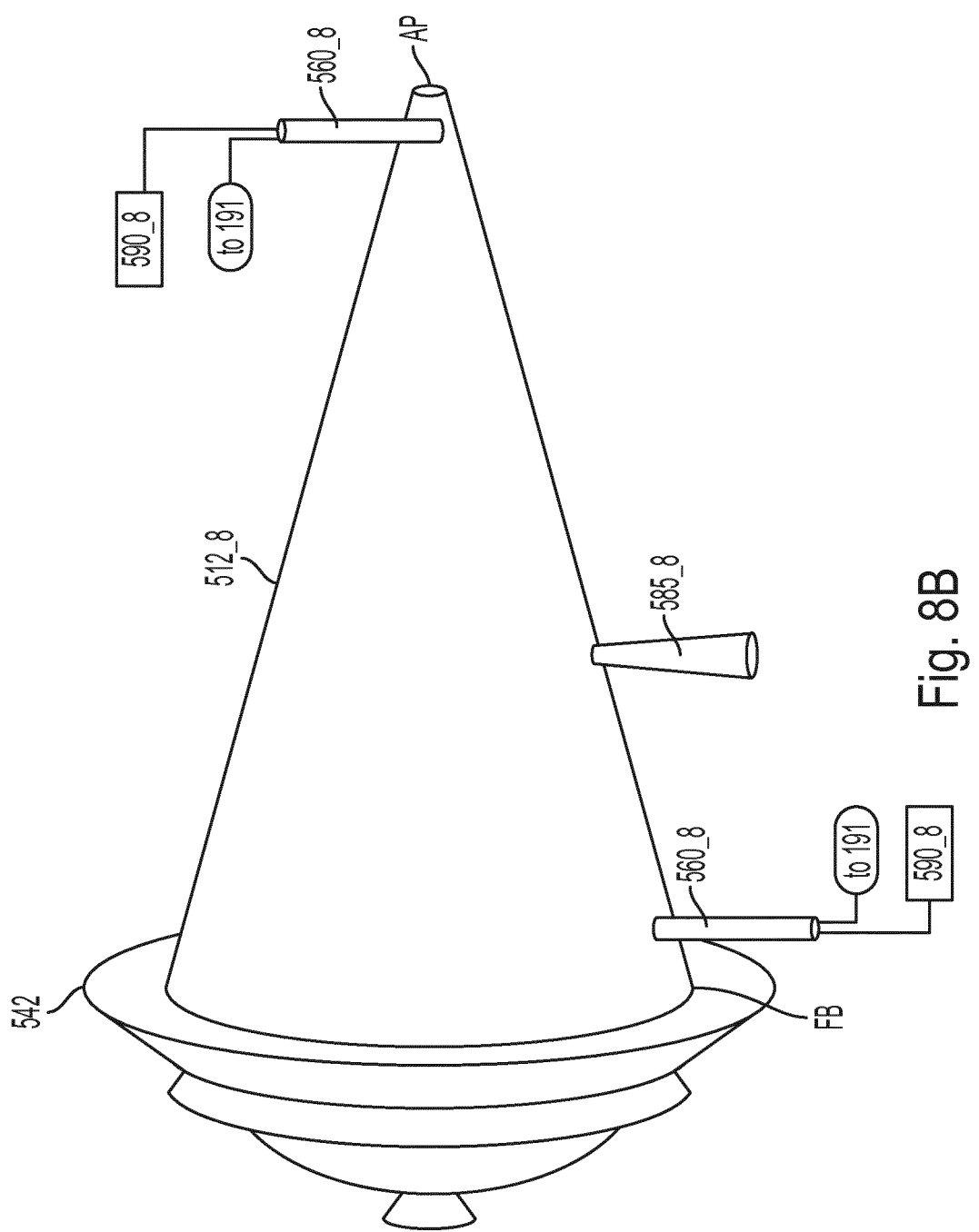
FIG. 8B is a perspective view of the cleaning apparatus of FIG. 8A, in which the liner is conically shaped.

Referring to FIGS. 8A and 8B, in another implementation, the cleaning apparatus 500_8 is implemented as a liner or sub-vessel 512_8 placed between the optical collector 542 and the intermediate focus IF. The cleaning apparatus 500_8 includes the liner 512_8, which is both the non-electrically conductive body and the structure having the exposed surfaces. The cleaning apparatus 500_8 includes an electrical conductor 560_8 that is embedded within the liner 512_8, and a temperature control system 590_8 in thermal contact with the electrical conductor 560_8. Thus, the cleaning apparatus 500_8 is configured similarly to the cleaning apparatus 100 shown in FIGS. 3A and 3B because the structure with the exposed surface is the same as the non-electrically conductive body (which is the liner 512_8). Thus, the liner 512_8 is made of a non-electrically conductive material such as a dielectric, which can be a ceramic. The liner 512_8 is shaped in a manner that permits the EUV light 545 to pass from the optical collector 542 to the intermediate focus IF without being blocked. A suitable shape for the liner 512_8 is a conical shape that tapers smoothly from a flat base FB positioned adjacent the optical collector 542 to an apex AP that opens to the intermediate focus IF. In other implementations, the liner 512_8 is cylindrical in shape, and its axis extends from the flat base FB to the intermediate focus IF. In other implementations, the liner 512_8 is the same shape as the vessel 525, except fits within the vessel 525.

Because the pressure at all of the surfaces of the liner 512_8 is at the same value (which is the value at which the chamber 520 is held), the electrical conductor 560_8 extends through and is embedded within the body of the liner 512_8 similar to the generic design shown in FIG. 4B. The electrical conductor 560_8 extends in the shape of a spiral from the flat base FB to the intermediate focus IF. The electrical conductor 560_8 electromagnetically induces the electric current at the location 561_8 adjacent the inside surface of the liner 512_8.

The cleaning apparatus 500_8 is designed to contain the target matter 555 to within the inside volume of the liner 512_8. Moreover, by containing the target matter 555, the cleaning apparatus 500_8 is able to more efficiently clean the debris from all surfaces within the chamber 520. All of the components of the EUV light source 502 that contribute to the production of the EUV light 545 are contained within the liner 512_8 so that all of these components will also get the benefit of the cleaning from the liner 512_8.

It is also possible to extend the liner 512_8 to wrap around the non-reflective side of the optical collector 542 to further enable the removal of the debris from the exposed surface of the optical collector 542.

Because the liner 512_8 serves as the non-electrically conductive body that is also the structure to be cleaned, the material of the liner 512_8 is made of one or more dielectrics to permit the current from the electrical conductor 560_8 to electromagnetically induce the current at the location 561_8. Additionally, because the temperature control system 590_8 can be implemented to cool the conductor 560_8 and also the liner 512_8, the liner 512_8 can be made of a highly thermally-conductive material (for example, having a thermal conductivity that is at least 100 W/m·K) to enable the efficient transfer of heat between the liner 512_8 and the conductor 560_8. In one example, the liner 512_8 is made of a ceramic material and the electrical conductor 560_8 is made of copper or a copper alloy.

In this way, the cleaning apparatus 500_8 serves at least two purposes. One, the cleaning apparatus 500_8 creates the plasma particles 175 at the location 561_8 next to the exposed surface of the liner 512_8. Two, the cleaning apparatus 500_8 cools the wall of the liner 512_8 to ensure a high removal rate of the debris on the surface of the liner 512_8 and also to prevent spitting of the target matter 555 from the surface of the liner 512_8. The cleaning apparatus 500_8 also includes a removal apparatus 585_8 for exhausting the new chemical 580 from the interior of the liner 512_8 and away from all the components of the EUV light source 502 that are exposed to the target matter 555.

Figure 9A:
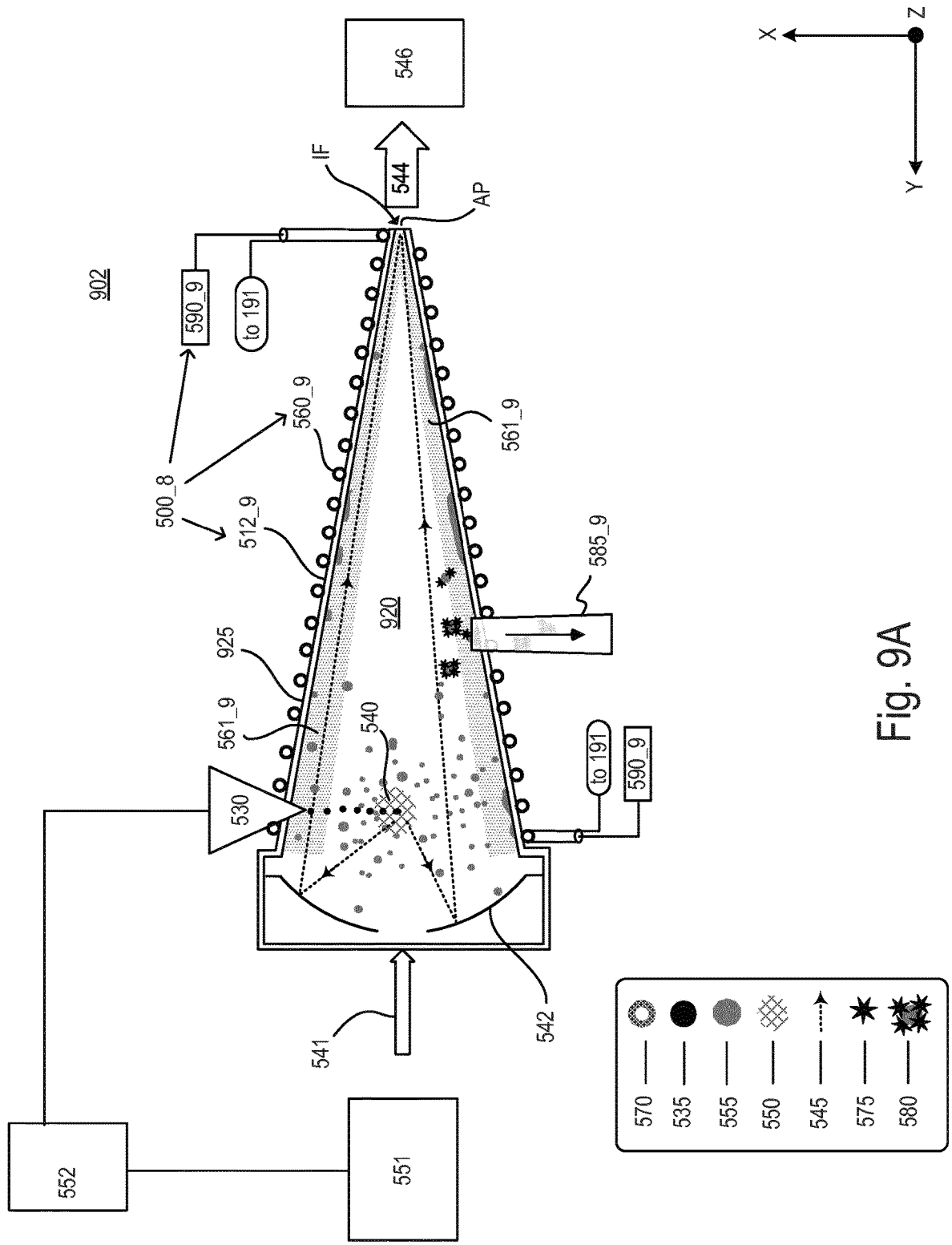
FIG. 9A is a block diagram of an EUV light source in which the cleaning apparatus is implemented as a liner or sub-vessel that is placed between an optical collector and an intermediate focus of the optical collector, in which the electrical conductor is contacting an outer surface of the liner body, and the liner body has a conical shape.
Figure 9B:
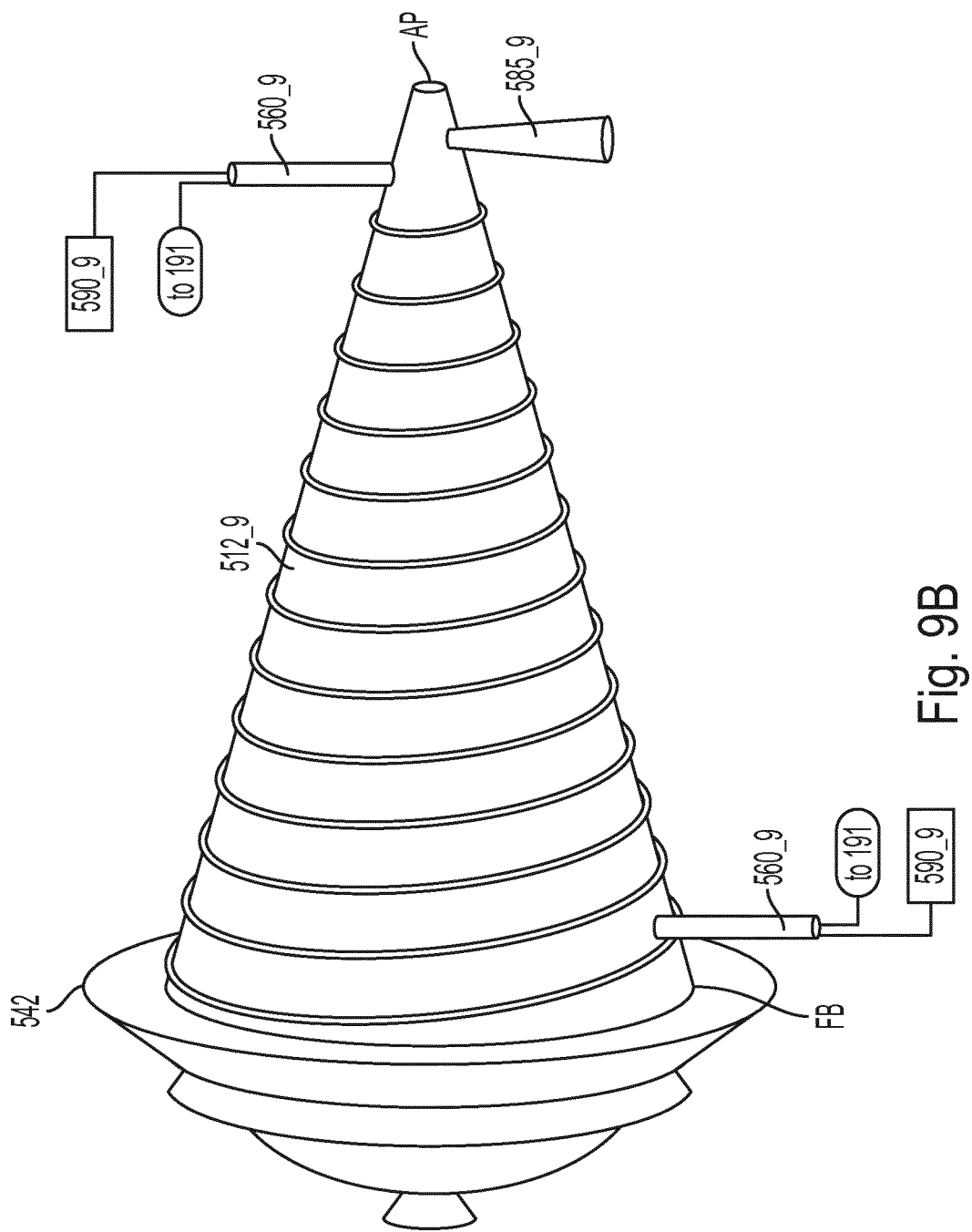
FIG. 9B is a perspective view of the cleaning apparatus of FIG. 9A.

Referring to FIGS. 9A and 9B, in another implementation, the cleaning apparatus 500_9 is implemented as a liner 512_9. The liner 512_9 provides a new design for the vessel 925. In the example of FIGS. 9A and 9B, the EUV chamber 920 is defined by the interior of the liner 512_9. The liner 512_9 is placed between the optical collector 542 and the intermediate focus IF. The cleaning apparatus 500_9 includes the liner 512_9, the electrical conductor 560_9 adjacent to and contacting the exterior surface of the liner 512_9, and the temperature control system 590_9 in thermal contact with the electrical conductor 560_9. The liner 512_9 is both the non-electrically conductive body and the structure having the exposed surfaces. Thus, the cleaning apparatus 500_9 is configured similarly to the cleaning apparatus 100 shown in FIGS. 3A and 3B because the structure with the exposed surface is the same as the non-electrically conductive body (which is the liner 512_9). Thus, the liner 512_9 is made of a non-electrically conductive material such as a dielectric such as ceramic. Similar to the liner 512_8, the liner 512_9 is shaped in a manner that permits the EUV light 545 to pass from the optical collector 542 to the intermediate focus IF without being blocked. A suitable shape for the liner 512_9 is a conical shape that tapers smoothly from a flat base FB positioned adjacent the optical collector 542 to an apex AP that opens to the intermediate focus IF.

Because the pressure at the exterior surface of the liner 512_9 is distinct from the pressure on the interior surface of the liner 512_9 (which is the value at which the chamber 920 is held), the electrical conductor 560_9 is not embedded within the body of the liner 512_9 and instead is placed on and contacting the exterior surface similar to the generic design shown in FIG. 4A. The electrical conductor 560_9 extends in the shape of a spiral from the flat base FB to the intermediate focus IF. The electrical conductor 560_9 electromagnetically induces the electric current at the location 561_9 adjacent the inside surface of the liner 512_9.

The cleaning apparatus 500_9 is designed to contain the target matter 555 to within the inside volume of the liner 512_9. By containing the target matter 555, the cleaning apparatus 500_9 is able to more efficiently clean the debris from all surfaces within the chamber 920. All of the components of the EUV light source 902 that contribute to the production of the EUV light 545 are contained within the liner 512_9 so that all of these components will also get the benefit of the cleaning from the liner 512_9.

Because the liner 512_9 is a new design for the vessel 925, it is configured to wrap around the non-reflective side of the optical collector 542 to further enable the removal of the debris from the exposed surface of the optical collector 542. Because the liner 512_9 serves as the non-electrically conductive body that is also the structure to be cleaned, the material of the liner 512_9 is dielectric to permit the current from the electrical conductor 560_9 to electromagnetically induce the current at the location 561_9. Additionally, because the temperature control system 590_9 can be implemented to cool the conductor 560_9 and also the liner 512_9, the liner 512_9 can be made of a highly thermally-conductive material to enable the efficient transfer of heat between the liner 512_9 and the conductor 560_9. In one example, the liner 512_9 is made of a ceramic material and the electrical conductor 560_9 is made of copper or a copper alloy.

In this way, the cleaning apparatus 500_9 serves two purposes as follows. One, the cleaning apparatus 500_9 creates the plasma particles 175 at the location 561_9 next to the exposed (interior) surface of the liner 512_9. Two, the cleaning apparatus 500_9 cools the wall of the liner 512_9 to ensure a high removal rate of the debris on the surface of the liner 512_9 and also to prevent spitting of the target matter 555 from the surface of the liner 512_9.

The cleaning apparatus 500_9 also includes a removal apparatus 585_9 for exhausting the new chemical 580 from the interior of the liner 512_9 and away from all the components of the EUV light source 902 that are exposed to the target matter 555.

In the above cleaning apparatuses 500_7, 500_8, and 500_9, the surface to be cleaned of debris was a wall that did not interact with light optically to lead to the production of the EUV light 545. As discussed next with reference to FIGS. 10A-10D, a cleaning apparatus 500_10 is designed to clean the reflective surface 1043 of the optical collector 1042. As discussed above, the reflective surface 1043 of the optical collector 1042 collects at least a portion of the EUV light 545 emitted from the light-emitting plasma 550 that is produced due to the interaction between the target 535 and the amplified light beam 541.

Because the reflective surface 1043 of the optical collector 1042 is made of several layers of different kinds of metal, it is not feasible or practical to contact the electrical conductor to a backside of the optical collector 1042 because a current directed through such electrical conductor would not efficiently induce a current at the location adjacent the reflective surface 1043. Thus, the cleaning apparatus 500_10 is designed similarly to the cleaning apparatus described with reference to FIGS. 2A and 2B in which the electrical conductor 560_10 is positioned inside a non-electrically conductive body 1065, and the plasma particles 575 are produced at the location 561_10 near the non-electrically conductive body 1065. These created plasma particles 575 are swept or pushed toward the exposed reflective surface 1043 by a fluid flow pattern 1066 that passes across the location 561_10 and toward and across the reflective surface 1043.

The non-electrically conductive body 1065 is a ring positioned around the circumference of the outer surface of the optical collector 1042, and the electrical conductor 560_10 is a copper tube that is embedded within the ring and extends along the perimeter of the outer surface of the optical collector 1042. The cleaning apparatus 500_10 can also include a temperature control system 590_10 configured to control a temperature of the electrical conductor 560_10 and therefore also control the temperature of the non-electrically conductive body 1065. The temperature control system 590_10 can be a cooling fluid (such as water) that is flowed adjacent a surface of the electrical conductor 560_10. For example, the electrical conductor 560_10 can be designed as a hollow tube, through which the cooling fluid can be flowed to cool the electrical conductor 560_10 and therefore also cool the non-electrically conductive body 1065.

An opening 1067 (shown in FIG. 10D) between the ring 1065 and the outer surface of the optical collector 1042 defines the location 561_10 at which the plasma particles 575 are created as long as the material 570 is flowed through the opening by way of the fluid flow pattern 1066. In this case, hydrogen as the material 570 is flowed by way of the fluid flow pattern 1066 through the opening and the location 561_10 and then across the reflective surface 1043 of the optical collector 1042. The ring 1065 is made of a dielectric such as a ceramic such as aluminum nitride. A shroud 1012 is also shown in FIGS. 10B and 10C; the shroud 1012 operates to provide the pathway for the targets 535 between the target delivery system 530 and the interacting region 540. The shroud 1012 can be designed similarly to the shroud 512_7 so that it is self-cleaning (with the cleaning apparatus 500_7).

Figure 11:
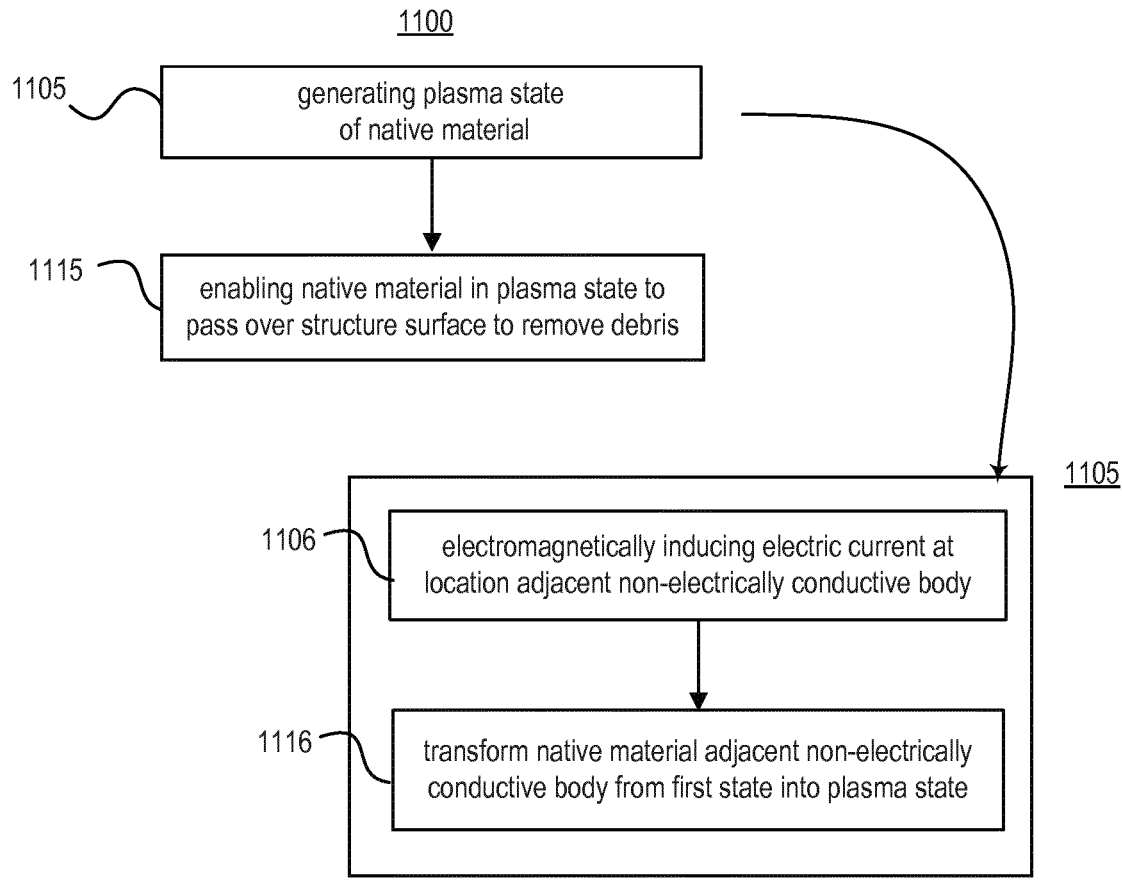
FIG. 11 is a flow chart of a procedure performed for cleaning the surface of the structure.

Referring to FIG. 11, a procedure 1100 is performed for cleaning the surface 110 of the structure 115. The procedure 1100 is performed by any of the above-described cleaning apparatuses 100, 500, 500_7, 500_8, 500_9, or 500_10. In the most basic description, reference is made to the cleaning apparatus 100 of FIGS. 1A and 1B and a specific example of the cleaning apparatus 500_7 is also discussed with reference to the procedure 1100.

The procedure 1100 begins by generating a plasma state of the material 170 at the location 161 adjacent the non-electrically conductive body 165 (1105). The plasma state of the material 170 includes the plasma particles 175, at least some of which are free radicals or ions of the material 170. The procedure 1100 also includes enabling these plasma particles 175 to pass over the exposed surface 110 of the structure 115 to remove the debris 105 from the exposed surface 110 without having to remove the structure 115 from the chamber 120 (1115).

The plasma state of the material 170 is generated (1105) by electromagnetically inducing electric current at the location 161 adjacent the non-electrically conductive body 165 (1106). This induced electric current (1106) thereby transforms the material 170 that is in that vicinity from its first state of matter (which can be a liquid, a gas, or a solid) into the plasma state (1116).

Figure 12:
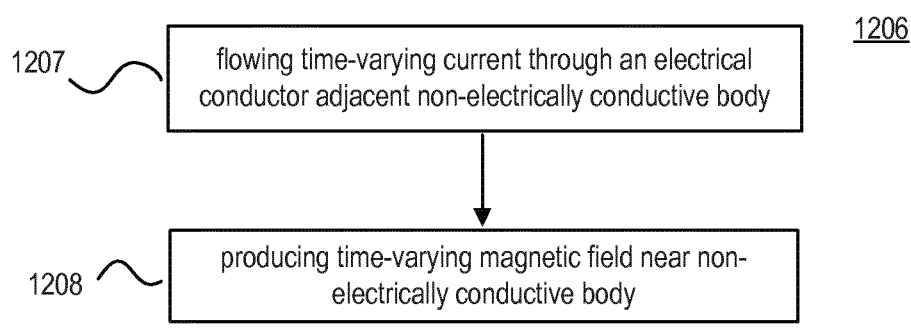
FIG. 12 is a flow chart of a procedure for inducing electric current at a location adjacent the non-electrically conductive body.

Referring next to FIG. 12, the electric current can be induced at the location adjacent the body 165 (1106) using the procedure 1206. Specifically, a time-varying electric current is flowed through the electrical conductor 160 that is adjacent the non-electrically conductive body 165 (1207). The electric current that is flowed through the electrical conductor 160 can be at a radio frequency. The flow of the electric current through the electrical conductor 160 (1207) thereby produces a time-varying magnetic field within the chamber 120 near the body 165 (1208). The time-varying magnetic field that is produced (1208) electromagnetically induces the electric current at the location 161 (1106).

The procedure 1100 can also include maintaining a temperature of the structure 115 and the exposed surface 110 to within a range of temperatures using the temperature control system 190. For example, the temperature of the structure 115 and the exposed surface 110 can be maintained below 50° C. but greater than a freezing temperature of the cooling fluid that is flowed through the interior passage 195 of the electrical conductor 160. Thus, the procedure 1100 can also include flowing or providing a cooling fluid (such as water) through an interior of the electrical conductor 160 (which can be an electrically conductive tubing that defines the interior).

The procedures 1100, 1105, and 1206 can be performed without the presence of oxygen.

As shown in the implementation of FIGS. 2A-2C, the non-electrically conductive body 165 can be distinct from the structure 115 with the exposed surface 110. In these implementations, then the plasma particles 175 can be enabled to pass over the exposed surface 110 of the structure 115 to remove the debris 105 from the exposed surface 110 (1115) by moving the plasma particles 175 from the location 161 near the body 165 toward and across the exposed surface 110 (for example, using the fluid flow pattern 266). The cleaning apparatus 500_10 of FIGS. 10A-10D is an example of such an implementation.

As shown in the implementation of FIGS. 3A-3B, the non-electrically conductive body 165 can be the same as the structure 115 with the exposed surface 110 and can be referred to as the structure 312. In these implementations, then, the location 161 adjacent the non-electrically conductive body 165 at which the plasma state of the material 170 is generated is actually adjacent the exposed surface 110 of the structure 115 and the plasma particles 175 are enabled to pass over the exposed surface 110 to remove the debris 105 (1115) as they are generated. The cleaning apparatus 500_7 of FIGS. 7A-7E is an example of such an implementation; the cleaning apparatus 500_8 of FIGS. 8A and 8B is another example of such an implementation; and the cleaning apparatus 500_9 of FIGS. 9A and 9B is yet another example of such an implementation.

The removal of the debris (1115) can occur by chemically reacting the plasma particles 175 (which are passing over the exposed surface 110) to chemically react with the debris 105 to form the new chemical 180, which is released from the exposed surface 110. The procedure 1100 can therefore also include removing the released new chemical 180 from the chamber 120.

Figure 13A:
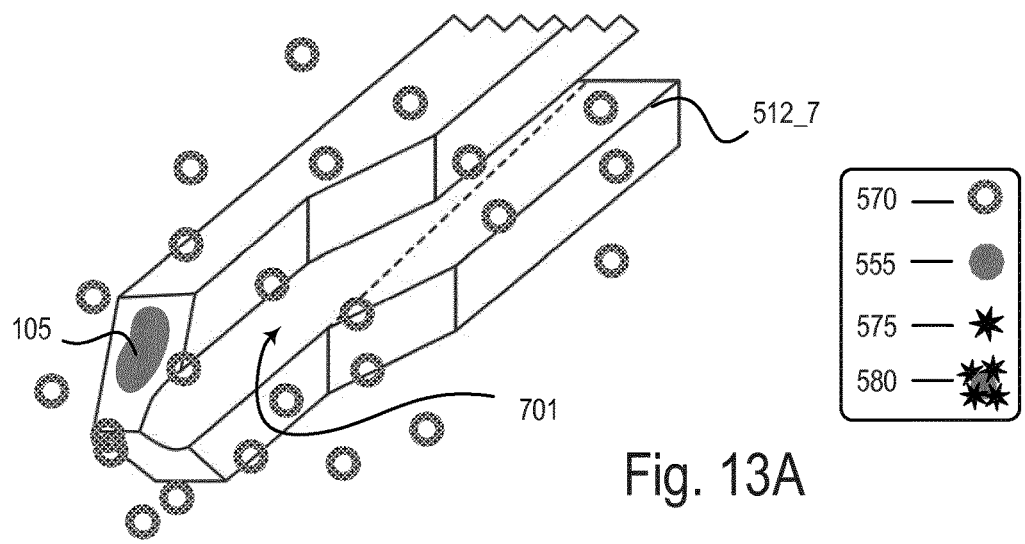
FIGS. 13A-13C are perspective views of the shroud showing the steps of the procedure of FIG. 12.
Figure 13B:
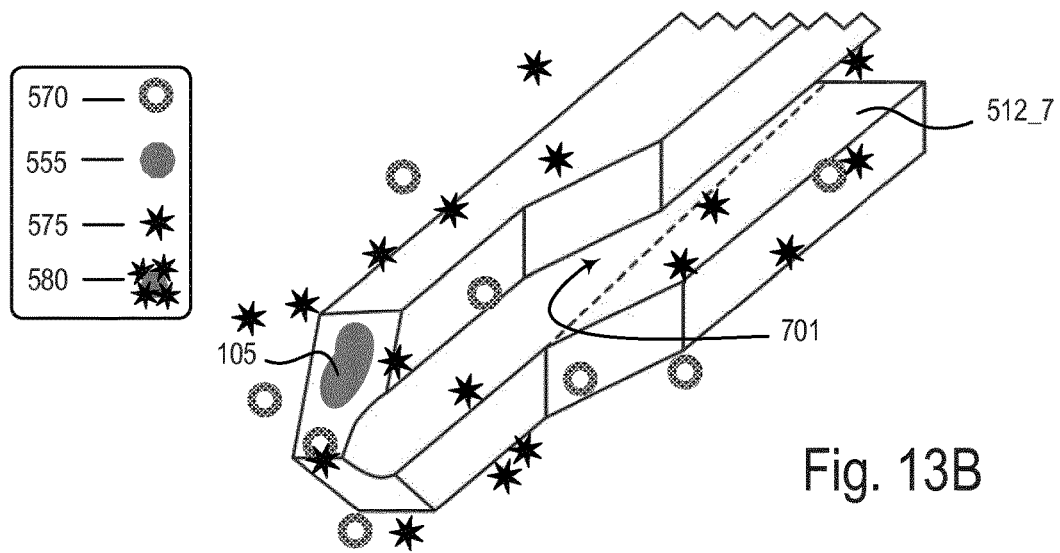
Figure 13C:
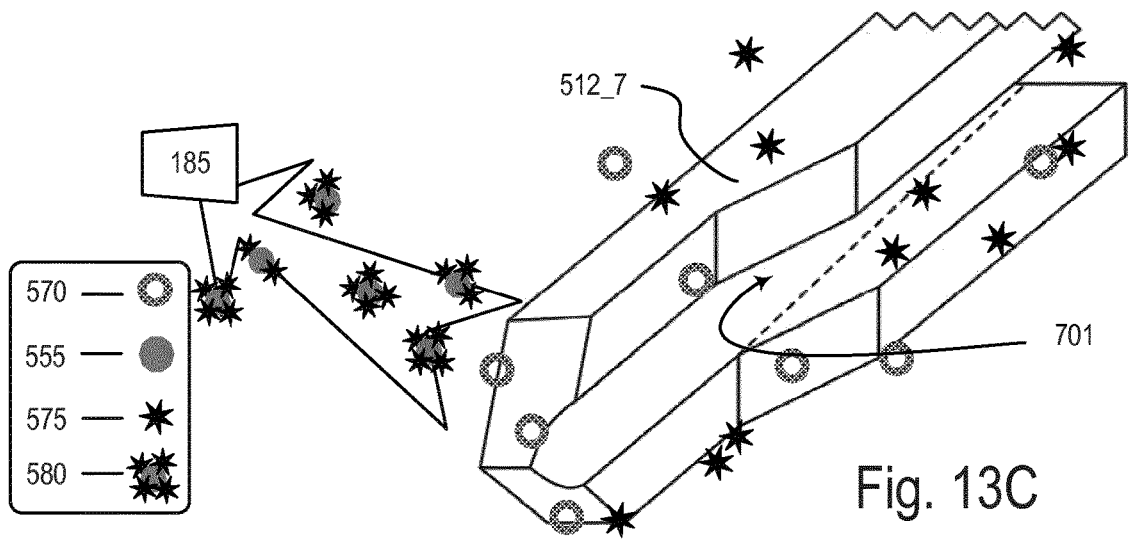

Referring to FIGS. 13A-13B, an example of the procedure 1100 is discussed with reference to the shroud 512_7. Initially, as shown in FIG. 13A, debris 105 has formed on an exposed surface of the shroud 512_7. In this example, only a small patch of debris 105 is shown but debris 105 can form over all of the exposed surfaces of the shroud 512_7. As discussed above, the debris 105 forms from leftover or remaining target matter 555. The cleaning apparatus 500_7 has not yet been turned on and thus the procedure 1100 has not yet begun in FIG. 13A. Next, as shown in FIG. 13B, the plasma state (which includes the plasma particles 575) is generated from the material 570 that is near the shroud 512_7 and within the chamber 520. Thus, in FIG. 13B, the plasma particles 575 have been produced. As shown in FIG. 13C, the plasma particles 575 are enables to pass over the exposed surfaces of the shroud 512_7 to thereby remove the debris 105 (which is released from the exposed surfaces as the new chemical 580).

Figure 14:
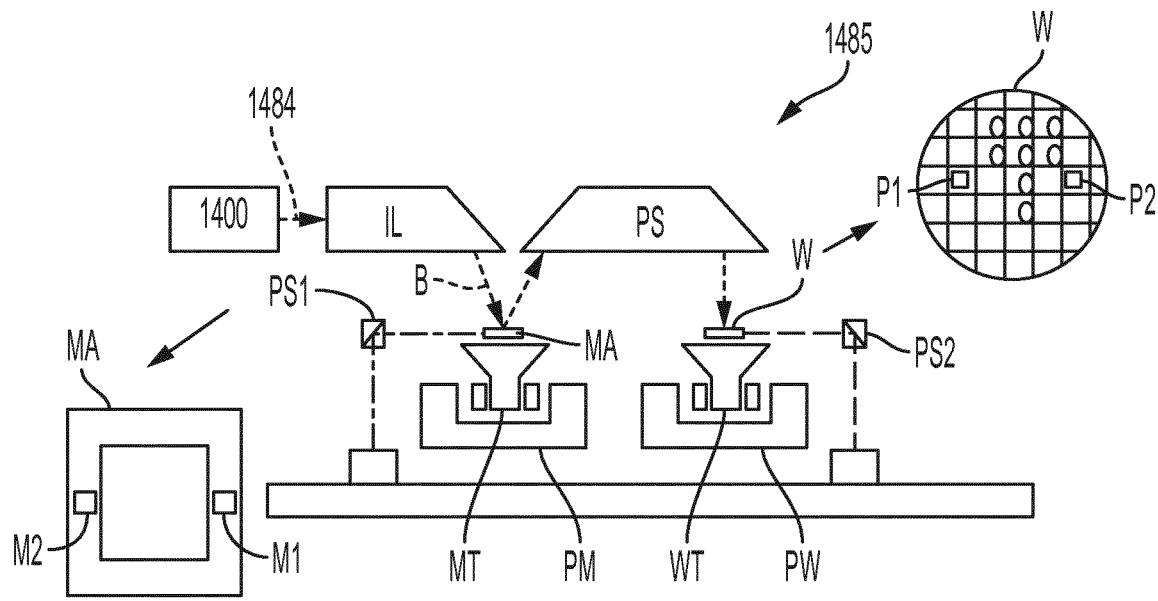
FIG. 14 is a block diagram of an EUV light source in which the cleaning apparatus can be used.

Referring to FIG. 14, in some implementations, the cleaning apparatus 100 (or 500, 500_7, 500_8, 500_9, or 500_10) is implemented within an EUV light source 1400 that supplies EUV light 1484 to a lithography apparatus 1485. The lithography apparatus 1485 includes an illumination system (illuminator) IL configured to condition a radiation beam B (for example, EUV light 1484); a support structure (for example, a mask table) MT constructed to support a patterning device (for example, a mask or a reticle) MA and connected to a first positioner PM configured to accurately position the patterning device; a substrate table (for example, a wafer table) WT constructed to hold a substrate (for example, a resist coated wafer) W and connected to a second positioner PW configured to accurately position the substrate; and a projection system (for example, a reflective projection system) PS configured to project a pattern imparted to the radiation beam B by patterning device MA onto a target portion C (for example, including one or more dies) of the substrate W.

The illumination system IL can include various types of optical components, such as refractive, reflective, magnetic, electromagnetic, electrostatic or other types of optical components, or any combination thereof, for directing, shaping, or controlling radiation. The support structure MT holds the patterning device MA in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT can be a frame or a table, for example, which can be fixed or movable as required. The support structure MT can ensure that the patterning device is at a desired position, for example, with respect to the projection system PS.

The term "patterning device" should be broadly interpreted as referring to any device that can be used to impart a radiation beam with a pattern in its cross-section such as to create a pattern in a target portion of the substrate. The pattern imparted to the radiation beam can correspond to a particular functional layer in a device being created in the target portion, such as an integrated circuit. The patterning device can be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system PS, like the illumination system IL, can include various types of optical components, such as refractive, reflective, magnetic, electromagnetic, electrostatic or other types of optical components, or any combination thereof, as appropriate for the exposure radiation being used, or for other factors such as the use of a vacuum. It can be desired to use a vacuum for EUV radiation since other gases may absorb too much radiation. A vacuum environment can therefore be provided to the whole beam path with the aid of a vacuum wall and vacuum pumps.

As here depicted, the apparatus is of a reflective type (for example, employing a reflective mask).

The lithographic apparatus can be of a type having two (dual stage) or more substrate tables (and/or two or more patterning device tables). In such "multi-stage" machines, the additional tables can be used in parallel, or preparatory steps can be carried out on one or more tables while one or more other tables are being used for exposure.

Figure 15:
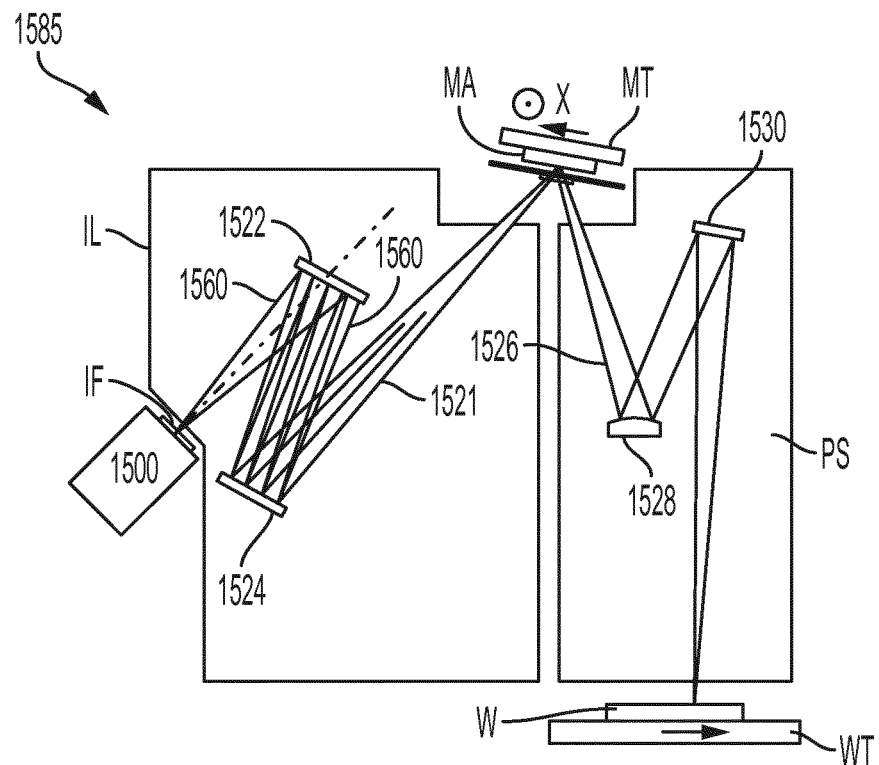
FIG. 15 is a block diagram of an EUV light source and a lithography apparatus that receives EUV light from the EUV light source.

Referring also to FIG. 15, the illuminator IL receives an extreme ultraviolet radiation beam (the EUV light 1575) from the EUV light source 1400. Methods to produce EUV light include, but are not necessarily limited to, converting a material into a plasma state that has at least one element, for example, xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The EUV light source 1400 can be designed like the EUV light source 502 or 902. As discussed above, the resulting plasma emits output radiation, for example, EUV radiation, which is collected using the optical element 542 (or a radiation collector).

The radiation beam B is incident on the patterning device (for example, mask) MA, which is held on the support structure (for example, mask table) MT, and is patterned by the patterning device. After being reflected from the patterning device (for example, mask) MA, the radiation beam B passes through the projection system PS, which focuses the beam onto a target portion C of the substrate W. With the aid of the second positioner PW and position sensor PS2 (for example, an interferometric device, linear encoder or capacitive sensor), the substrate table WT can be moved accurately, for example, so as to position different target portions C in the path of the radiation beam B. Similarly, the first positioner PM and another position sensor PS1 can be used to accurately position the patterning device (for example mask) MA with respect to the path of the radiation beam B. Patterning device (for example mask) MA and substrate W can be aligned using patterning device alignment marks M1, M2 and substrate alignment marks P1, P2.

The depicted apparatus could be used in at least one of the following modes:

1. In step mode, the support structure (for example, mask table) MT and the substrate table WT are kept essentially stationary, while an entire pattern imparted to the radiation beam is projected onto a target portion C at one time (that is, a single static exposure). The substrate table WT is then shifted in the X and/or Y direction so that a different target portion C can be exposed.
2. In scan mode, the support structure (for example, mask table) MT and the substrate table WT are scanned synchronously while a pattern imparted to the radiation beam is projected onto a target portion C (that is, a single dynamic exposure). The velocity and direction of the substrate table WT relative to the support structure (for example, mask table) MT may be determined by the (de)magnification and image reversal characteristics of the projection system PS.
3. In another mode, the support structure (for example, mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

FIG. 15 shows an implementation of the lithographic apparatus 1585 in more detail, including the EUV light source 1500, the illumination system IL, and the projection system PS. The EUV light source 1500 is constructed and arranged as discussed above when describing EUV light source 502 or 902.

The systems IL and PS are likewise contained within vacuum environments of their own. The intermediate focus (IF) of the EUV light source 1500 is arranged such that it is located at or near an aperture in an enclosing structure. The virtual source point IF is an image of the radiation emitting plasma (for example, the EUV light 145 or 545).

From the aperture at the intermediate focus IF, the radiation beam traverses the illumination system IL, which in this example includes a facetted field mirror device 1522 and a facetted pupil mirror device 1524. These devices form a so-called "fly's eye" illuminator, which is arranged to provide a desired angular distribution of the radiation beam 1521, at the patterning device MA, as well as a desired uniformity of radiation intensity at the patterning device MA (as shown by reference 1560). Upon reflection of the beam 1521 at the patterning device MA, held by the support structure (mask table) MT, a patterned beam 1526 is formed and the patterned beam 1526 is imaged by the projection system PS via reflective elements 1528, 1530 onto a substrate W held by the substrate table WT. To expose a target portion C on substrate W, pulses of radiation are generated while substrate table WT and patterning device table MT perform synchronized movements to scan the pattern on patterning device MA through the slit of illumination.

Each system IL and PS is arranged within its own vacuum or near-vacuum environment, defined by enclosing structures similar to EUV chamber 520. More elements than shown may generally be present in illumination system IL and projection system PS. Further, there can be more mirrors present than those shown. For example, there may be one to six additional reflective elements present in the illumination system IL and/or the projection system PS, besides those shown in FIG. 15.

Referring again to FIG. 5, the target delivery system 530 can include a droplet generator arranged within the EUV chamber 520, and arranged to fire the high frequency stream 532 of droplets (targets 535) toward the interacting region 540. In operation, the amplified light beam 541 is delivered in synchronization with the operation of droplet generator, to deliver pulses of radiation to turn each droplet (each target 535) into the light-emitting plasma 550. The frequency of delivery of the droplets can be several kilohertz, for example 50 kHz.

In some implementations, the energy from the amplified light beam 541 is delivered in at least two pulses: namely, a pre pulse with limited energy is delivered to the droplet before it reaches the interacting region 540, in order to vaporize the fuel material into a small cloud, and then a main pulse of energy is delivered to the cloud at the interacting region 540, to generate the light-emitting plasma 550. A trap (which can be, for example, a receptacle) is provided on the opposite side of the EUV chamber 520, to capture this fuel (that is, the target matter 555 or the target 535) that is not, for whatever reason, turned into plasma.

The droplet generator in the target delivery system 530 includes a reservoir that contains the fuel liquid (for example, molten tin) and a filter and a nozzle. The nozzle is configured to eject droplets of the fuel liquid toward the interacting region 540. The droplets of fuel liquid can be ejected from the nozzle by a combination of pressure within the reservoir and a vibration applied to the nozzle by a piezoelectric actuator (not shown).

Other implementations are within the scope of the following claims.

For example, although the optical collector 542 shown herein is a single curved mirror, it can take other forms. For example, the optical collector 542 can be a Schwarzschild collector having two radiation collecting surfaces. In another implementation, the optical collector 542 is a grazing incidence collector that includes a plurality of substantially cylindrical reflectors nested within one another.

Figure 16A:
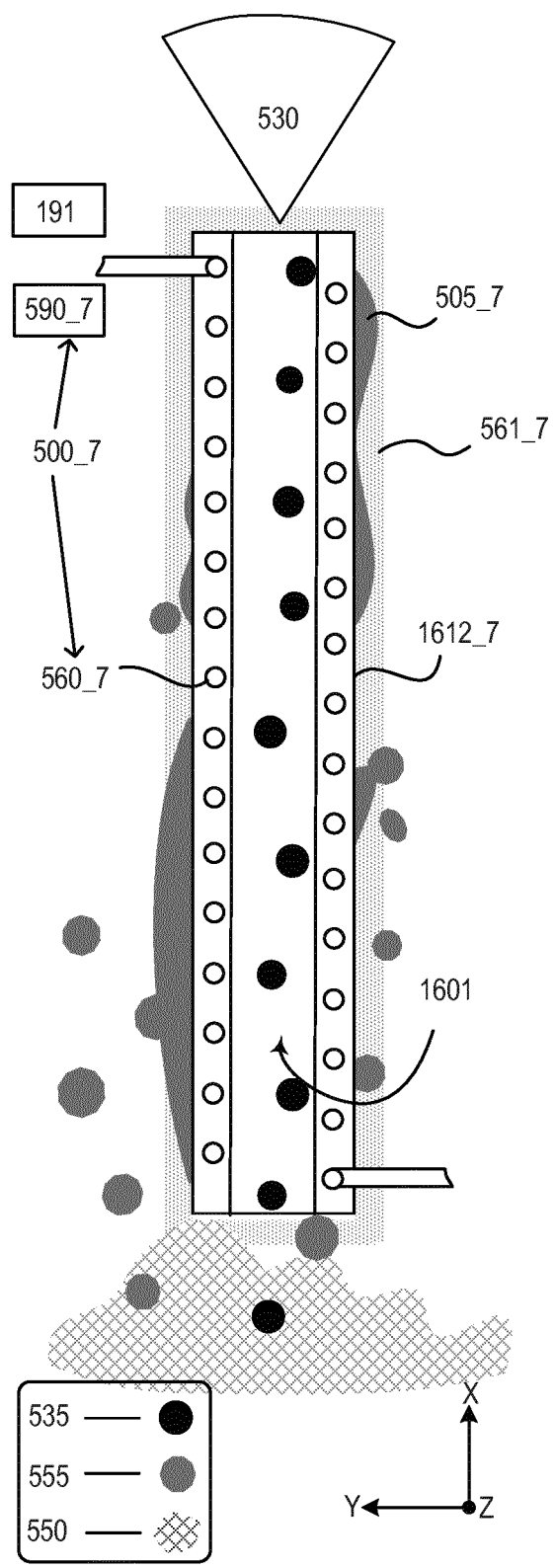
FIG. 16A is a plan view of another implementation of the cleaning apparatus and the shroud that is cleaned in FIG. 7A taken along the XY plane.
Figure 16B:
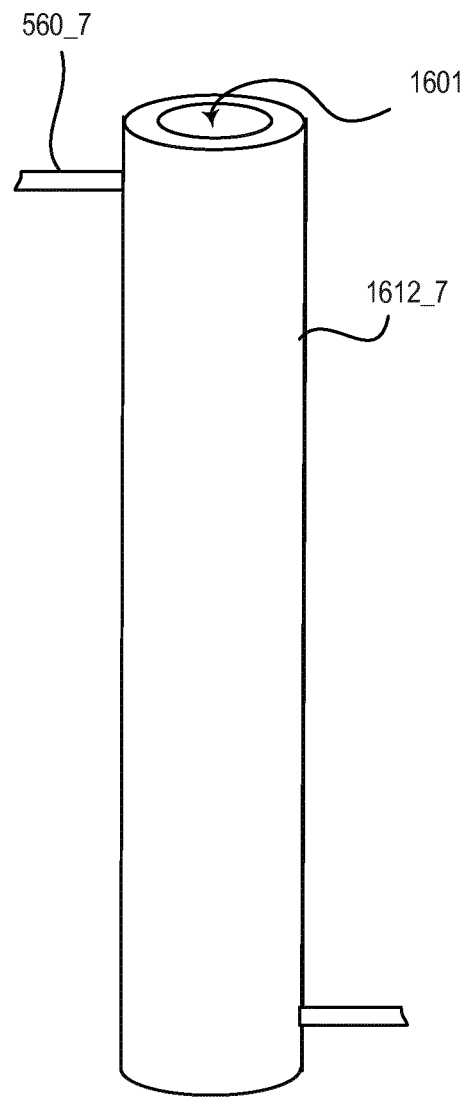
FIG. 16B is a perspective view of the cleaning apparatus and the shroud of FIG. 16A.

As another example, the shroud 512_7 can have a different geometric design than what is shown in FIGS. 7A-7E. For example, as shown in FIGS. 16A and 16B, the shroud 512_7 can be shaped as a hollow cylinder 1612_7 that extends along an axial direction from the target delivery system 530 to the interacting region 540. The targets 535 pass axially through the opening of the hollow cylinder. In this case, the shroud 1612_7 that is shaped as a hollow cylinder provides a fully-protected passageway 1601.

As another example, the shroud 512_7 can be shaped as a flat panel that provides a barrier to disruption of the targets 535 from turbulent flow along one direction along the path from the target delivery system 530 toward the interacting region 540.

Figure 17A:
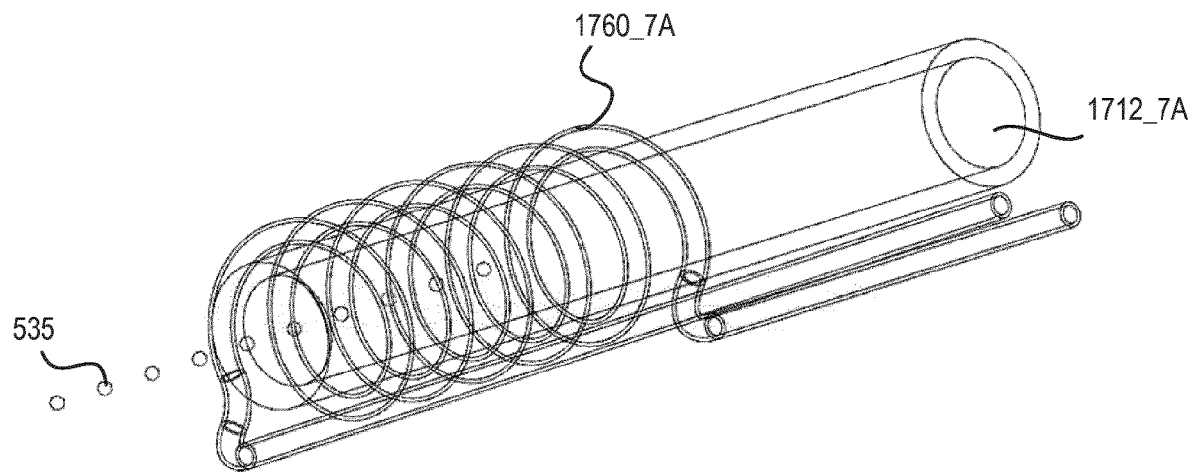
FIG. 17A is a perspective view of an implementation of a cleaning apparatus and a tubular shroud that is cleaned.

Referring to FIG. 17A, in some implementations, the shroud 512_7 is designed as a hollow cylinder 1712_7A similar to the hollow cylinder 1612_7. The shroud 512_7 is made of a dielectric material. However, electrical conductor 1760_7A is not embedded within the body of the shroud 1712_7A and instead is placed around the exterior surface similar to the generic design shown in FIG. 4A. The electrical conductor 1760_7A extends in the shape of a spiral along the longitudinal axis of the shroud 1712_7A, such longitudinal axis generally aligning with the –X direction.

Figure 17B:
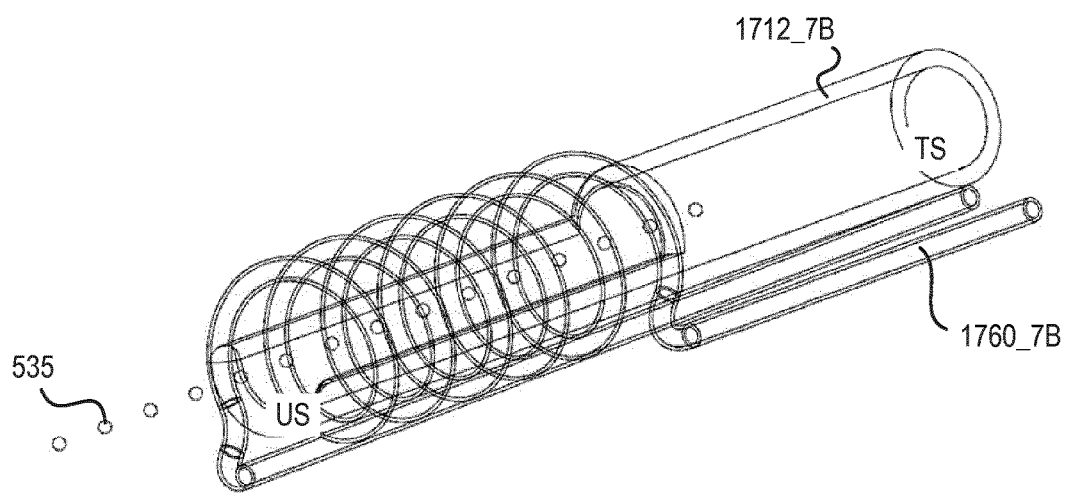
FIG. 17B is a perspective view of an implementation of a cleaning apparatus and a hybrid (tubular and u-shaped) shroud that is cleaned.

With reference to FIG. 17B, in other implementations, the shroud 512_7 is designed as a hybrid structure 1712_7B that includes a tubular section TS (similar to the shroud 1712_7A) and a U-shaped section US (similar to the shroud 512_7) around which an electrical conductor 1760_7B is wound.

In some implementations, the electrical conductors 1760_7A, 1760_7B are electrically insulated by the low pressure hydrogen $H_2$ that encompasses the electrical conductors. Moreover, the electrical conductors 1760_7A, 1760_7B do not need to be in contact with the body of the shroud 512_7 (which is made of a dielectric material). In some implementations, the electrical conductors 1760_7A, 1760_7B are coated with a dielectric material.

Figure 18A:
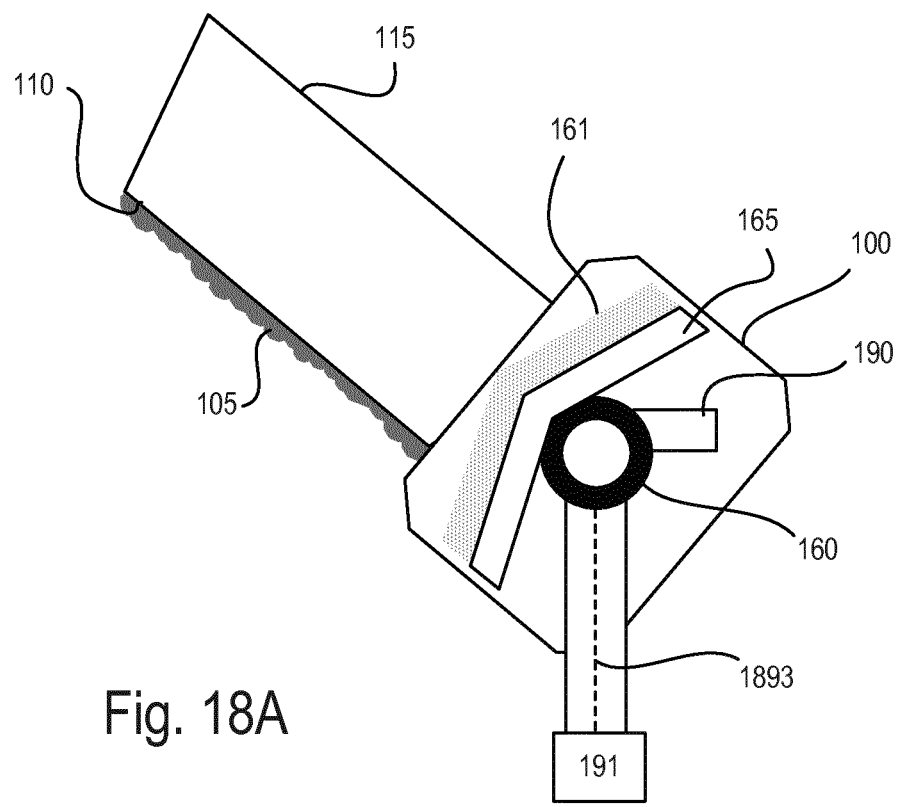
FIG. 18A is a block diagram showing an implementation of a power source that supplies a single electric current to the electrical conductor of FIGS. 1A and 1B.

Referring to FIG. 18A, in some implementations, the power source 191 is configured to supply a single electric current 1893 (depicted as a dashed line) to the electrical conductor 160.

Figure 18B:
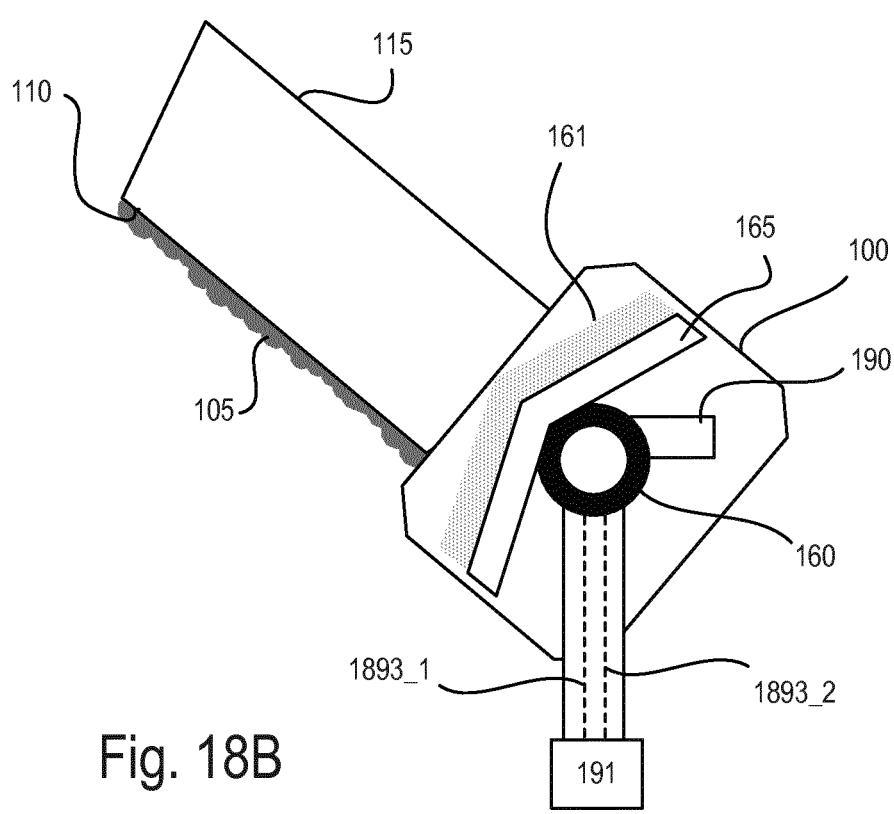
FIG. 18B is a block diagram showing an implementation of a power source that supplies a first electric current and a second electric current to the electrical conductor of FIGS. 1A and 1B.

In other implementations, as shown in FIG. 18B, the power source 191 is configured to supply a first electric current 1893_1 at a first frequency to the electrical conductor 160 and a second electric current 1893_2 at a second frequency to the electrical conductor 160. The second frequency is distinct from the first frequency. In such implementations, the cleaning apparatus 100 can perform two functions.

A first function is as discussed above, that is, to remove debris 105 from the exposed surface 115. In order to perform this first function, the electrical conductor 160 is supplied with the first electric current 1893_1 at the first frequency. The first frequency is selected to enable this first function of removing debris 105 from the exposed surface 115. Thus, as discussed above, the first frequency can be a radio frequency. For example, the first frequency can be in a range of 500 kHz to 3 GHz.

A second function is to directly couple heat to the debris 105 (by way of induction heating) without heating the non-electrically conductive body 165 and/or the structure 115. That is, the application of the second electric current 1893_2 at the second frequency to the electrical conductor 160 thereby inductively heats and evaporates the debris 105 on the structure surface. In order to perform the second function, the electrical conductor 160 is supplied with the second electric current 1893_2. The second frequency can be less than radio frequency. For example, the second frequency can be below 500 kHz or in a range of 100 Hz to 200 kHz. The use of the second current 1893_2 avoids or reduces the amount of resistive heating that is applied to the non-electrically conductive body 165 and/or the structure 115.

The second frequency 1893_2 should be distinct enough from the first frequency so that both frequencies can be applied simultaneously or alternatingly in time. For example, the second frequency 1893_2 can be less than 200 kHz. The second electric current 1893_2 can be supplied simultaneously with, individually from, or alternating with the first electric current 1893_2. The power source 191 can provide the first and second currents 1893_1, 1893_2 as alternating current (AC) or as pulsating direct current (DC). For example, the power source 191 can be configured to apply a dual frequency alternating current to the electrical conductor 160. As another example, the power source 191 can be configured to apply a pulsating direct current to the electrical conductor 160.

The embodiments may further be described using the following clauses:

1. A method of cleaning a surface of a structure within a chamber of an extreme ultraviolet (EUV) light source, the method comprising:
   generating a plasma state of a material present at a location adjacent to a non-electrically conductive body that is within the chamber, the generating comprising:
   electromagnetically inducing an electric current at the location adjacent the non-electrically conductive body to thereby transform the material that is adjacent the non-electrically conductive body from a first state into the plasma state, wherein the plasma state of the material includes plasma particles, at least some of which are free radicals of the material; and
   enabling the plasma particles to pass over the structure surface to remove debris from the structure surface without removing the structure from the chamber of the EUV light source.
2. The method of clause 1, further comprising maintaining a temperature of the structure below 50° C.
3. The method of clause 1, wherein the structure surface is positioned to optically interact with and modify light present in the chamber.
4. The method of clause 1, wherein generating the plasma state of the material comprises generating the plasma state of the material without the presence of oxygen.
5. The method of clause 1, wherein generating the plasma state of the material comprises generating the plasma state of the material without reducing the amount of material flowing across the structure surface.
6. The method of clause 1, wherein electromagnetically inducing the electric current comprises flowing an electric current through an electrically conductive tubing adjacent the non-electrically conductive body.
7. The method of clause 6, wherein the electric current flowing through the electrically conductive tubing is at radio frequency.
8. The method of clause 1, wherein electromagnetically inducing the electric current comprises generating microwave radiation at the non-electrically conductive body or propagating an electromagnetic surface wave along the non-electrically conductive body.
9. The method of clause 6, further comprising providing a cooling fluid through an interior of the electrically conductive tubing to maintain a temperature of the non-electrically conductive body or the structure below a threshold temperature.
10. The method of clause 6, wherein:
    the structure includes the non-electrically conductive body; and
    generating the plasma state of the material at the location adjacent to the non-electrically conductive body comprises generating the plasma state of the material at a location adjacent the structure surface.
11. The method of clause 6, wherein the structure is distinct from the non-electrically conductive body.
12. The method of clause 11, wherein enabling the plasma state of the material to pass over the structure surface comprises moving the plasma particles from a location near the non-electrically conductive body toward and across the structure surface.
13. The method of clause 1, wherein:
    electromagnetically inducing the electric current at the location adjacent the non-electrically conductive body comprises producing a time-varying magnetic field within the chamber near the non-electrically conductive body; and
    producing the time-varying magnetic field within the chamber comprises flowing a time-varying electric current through an electrical conductor that is adjacent the non-electrically conductive body.
14. The method of clause 1, wherein the plasma particles include at least ions, electrons, and free radicals of the material.
15. The method of clause 1, wherein the material comprises hydrogen.
16. The method of clause 1, wherein removing debris from the structure surface comprises chemically reacting the plasma particles with the debris on the structure surface to form a chemical that is released from the structure surface.
17. The method of clause 16, further comprising removing the released chemical from the chamber.
18. The method of clause 16, wherein:
    the material includes hydrogen, and the plasma particles include free radicals of hydrogen;
    the debris on the substrate surface includes tin or carbon; and
    the released chemical includes tin hydride if the debris includes tin or methane if the debris includes carbon.
19. The method of clause 1, wherein the chamber is held at a pressure below atmospheric pressure.
20. The method of clause 1, wherein the non-electrically conductive body is made of a dielectric.
21. The method of clause 1, wherein electromagnetically inducing the electric current comprises flowing an electric current through an electrical conductor adjacent the non-electrically conductive body, and flowing the electric current through the electrical conductor comprises applying a first electric current at a first frequency to the electrical conductor and applying a second electric current at a second frequency that is distinct from the first frequency to the electrical conductor.

22. The method of clause 21, wherein the first frequency is a radio frequency and the second frequency is lower than the radio frequency.

23. The method of clause 21, wherein applying the first electric current and the second electric current comprises applying dual frequency alternating current or a pulsating direct current to the electrical conductor.

24. The method of clause 21, wherein:
applying the first electric current at the first frequency to the electrical conductor thereby transforms the material that is adjacent the non-electrically conductive body from a first state into a plasma state of the material that includes the plasma particles; and
applying the second electric current at the second frequency to the electrical conductor thereby inductively heats and evaporates debris on the structure surface.

25. An apparatus comprising:
an extreme ultraviolet (EUV) light source comprising:
a chamber; and
a target delivery system configured to direct a target toward an interaction region in the chamber, the target comprising matter that emits extreme ultraviolet light when it is converted into a plasma;
a structure within the chamber that includes an exposed surface;
a cleaning apparatus near the structure and configured to remove target debris from the exposed surface of the structure without removing the structure from the chamber, the cleaning apparatus comprising:
an electrical conductor contacting a non-electrically conductive body,
wherein the cleaning apparatus is configured to electromagnetically induce an electric current at a location adjacent the non-electrically conductive body to thereby transform a material that is present in the chamber from a first state into a plasma state that includes plasma particles, at least some of which are free radicals and ions of the material, and
wherein the non-electrically conductive body is configured relative to the structure such that the plasma particles come in contact with the debris on the exposed surface of the structure.

26. The apparatus of clause 25, further comprising a temperature control system thermally coupled to the electrical conductor, wherein the temperature control system is configured to maintain a temperature of the structure adjacent the cleaning apparatus to within a threshold range.

27. The apparatus of clause 26, wherein the temperature control system maintains a temperature of the structure adjacent the cleaning apparatus to below a threshold maximum value.

28. The apparatus of clause 27, wherein the threshold maximum value is 50° C.

29. The apparatus of clause 25, wherein the temperature control system includes a fluid control system that is configured to feed a cooling fluid through an interior passage of the electrical conductor.

30. The apparatus of clause 25, wherein the exposed surface optically interacts with and modifies light.

31. The apparatus of clause 30, wherein the light is an amplified light beam that interacts with the target or is EUV light produced by the target.

32. The apparatus of clause 25, further comprising a flow apparatus configured to flow the plasma particles from the location adjacent the non-electrically conductive body toward and over the exposed surface.

33. The apparatus of clause 25, wherein electromagnetically inducing the electric current comprises flowing an electric current through the electrical conductor, and the electric current flowing through the electrical conductor is at radio frequency.

34. The apparatus of clause 25, wherein the structure having the exposed surface and the non-electrically conductive body are the same physical structure.

35. The apparatus of clause 25, wherein the structure having the exposed surface is physically distinct from the non-electrically conductive body.

36. The apparatus of clause 25, wherein the non-electrically conductive body includes a shroud that includes a passageway for the target from the target delivery system to the interaction region.

37. The apparatus of clause 25, wherein the structure having the exposed surface is a collector mirror of the EUV light source, the collector mirror positioned to capture at least a portion of the EUV light emitted from the plasma, and the non-electrically conductive body includes a ring positioned around an outer surface of the collector mirror.

38. The apparatus of clause 25, wherein:
the structure having the exposed surface is the non-electrically conductive body;
the EUV light source includes a liner between the collector mirror and an intermediate focus; and
the structure comprises the liner, an interior surface of the liner facing the EUV light reflected from the collector mirror toward the intermediate focus and constituting the exposed structure surface.

39. The apparatus of clause 38, wherein the electrical conductor is positioned outside an exterior surface of the liner if the exterior surface of the liner is at a different pressure than the pressure at the interior surface, or the electrical conductor embedded in the liner if the exterior surface of the liner is held at the same pressure as the interior surface; and
the induced electric current is at the interior surface of the liner.

40. The apparatus of clause 38, wherein the liner has a conical shape that tapers smoothly from a flat base positioned adjacent the collector mirror to an apex that opens to the intermediate focus.

41. The apparatus of clause 25, wherein the non-electrically conductive body is made of a dielectric.

42. The apparatus of clause 41, wherein the dielectric includes a ceramic.

43. The apparatus of clause 41, wherein the ceramic includes aluminum nitride or boron nitride.

44. The apparatus of clause 25, wherein the target includes tin and the material includes hydrogen, wherein the cleaning apparatus is configured to remove one or more of tin debris and carbon debris from the exposed surface of the structure without the presence of oxygen.

45. The apparatus of clause 25, wherein:
the electrical conductor is embedded within the non-electrically conductive body if the pressure on first and second sides of the non-electrically conductive body is equal; or
the electrical conductor is adjacent to and at an exterior of the first side of the non-electrically conductive body if the pressure on the first side is different from the pressure on the second side of the non-electrically conductive body.
46. The apparatus of clause 25, wherein the chamber is held at a pressure below atmospheric pressure.
47. The apparatus of clause 25, further comprising a power source configured to supply current to the electrical conductor.
48. The apparatus of clause 47, further comprising a control apparatus to which the power source is connected, the control apparatus configured to send a signal to the power source to thereby operate the cleaning apparatus.
49. The apparatus of clause 25, further comprising a fluid port configured to introduce the material into the chamber.
50. The apparatus of clause 25, wherein the cleaning apparatus is configured to electromagnetically induce an electric current at a location adjacent the non-electrically conductive body by propagating an electromagnetic surface wave along the non-electrically conductive body or generating microwave radiation at the non-electrically conductive body.
51. The apparatus of clause 25, wherein the cleaning apparatus includes a power source electrically connected to supply current to the electrical conductor, wherein the power source is configured to supply a first electric current at a first frequency to the electrical conductor and a second electric current at a second frequency to the electrical conductor, wherein the second frequency is distinct from the first frequency.
52. The apparatus of clause 51, wherein the first frequency is a radio frequency and the second frequency is less than radio frequency.
53. The apparatus of clause 51, wherein the power source is configured to apply either a dual frequency alternating current or a pulsating direct current to the electrical conductor.
54. An apparatus comprising:
an extreme ultraviolet (EUV) light source comprising:
  a chamber; and
  a target delivery system configured to direct a target toward an interaction region in the chamber, the target comprising matter that emits extreme ultraviolet light when it is converted into a plasma; and
  a shroud within the chamber that defines a channel extending from the target delivery system to the interaction region, exterior surfaces of the shroud being exposed to debris produced from the target, wherein the shroud includes:
    a non-electrically conductive body that defines the channel, and
    an electrical conductor adjacent the non-electrically conductive body;
  wherein the electrical conductor electromagnetically induces an electric current at a location adjacent the shroud to thereby transform a material that is present in the chamber from a first state into a plasma state that includes plasma particles, at least some of which are free radicals and ions of the material; and
  wherein the electrical conductor is positioned relative to the non-electrically conductive body such that the plasma particles chemically react with debris fixed to the exposed shroud surfaces to thereby release the debris from the exposed shroud surfaces.
55. The apparatus of clause 54, further comprising a temperature control system thermally coupled to the electrical conductor, wherein the temperature control system is configured to maintain a temperature of the channel surface below a threshold value.
56. The apparatus of clause 55, wherein the temperature control system is configured to cool the channel surface to thereby prevent the debris from melting at the channel surface.
57. The apparatus of clause 54, wherein:
the electrical conductor is embedded within the non-electrically conductive body; and/or
the electrical conductor is in contact with the non-electrically conductive body.
58. The apparatus of clause 54, wherein the non-electrically conductive body is made of a dielectric.
59. The apparatus of clause 54, wherein the electrical conductor wraps around an exterior surface of the non-electrically conductive body and the electrical conductor is coated in a dielectric material.

What is claimed is:
1. A method of cleaning a surface of a structure within a chamber of an extreme ultraviolet (EUV) light source, the method comprising:
generating a plasma state of a material present at a location adjacent to the structure, the generating comprising:
electromagnetically inducing an electric current at the location adjacent the structure to thereby transform the material that is present in the chamber and is adjacent the structure from a first state into the plasma state, wherein the plasma state of the material includes plasma particles, at least some of which are free radicals of the material, and electromagnetically inducing the electric current comprises inducing a surface wave along the surface of the structure by supplying current to an electrical conductor contacting the structure, the current in a range that produces microwave radiation; and
enabling the plasma particles to pass over the structure surface to remove debris from the structure surface without removing the structure from the chamber of the EUV light source and without halting operation of the structure by propagating the surface wave along the surface of the structure.
2. The method of claim 1, further comprising removing the debris from the chamber.
3. The method of claim 1, wherein:
electromagnetically inducing the electric current at the location adjacent the structure comprises producing a time-varying magnetic field within the chamber; and
producing the time-varying magnetic field within the chamber comprises flowing a time-varying electric current through the electrical conductor in contact with the structure.
4. The method of claim 1, wherein generating the plasma state of the material comprises generating the plasma state of the material without the presence of oxygen.
5. The method of claim 1, wherein the plasma particles include at least ions, electrons, and free radicals of the material.
6. The method of claim 1, wherein the structure surface is positioned to optically interact with and modify light present in the chamber.
7. The method of claim 1, wherein removing debris comprises chemically reacting the plasma particles with debris at the structure surface to form a new chemical that is released from the structure surface.

8. The method of claim 1, wherein the microwave radiation has a frequency that lies in a range extending from 1 gigahertz (GHz) to 300 GHz.

9. A method of cleaning a surface of a structure within a chamber of an extreme ultraviolet (EUV) light source, the method comprising:
generating a plasma state of a material present at a location adjacent to a non-electrically conductive body that is within the chamber, the generating comprising:
electromagnetically inducing an electric current at the location adjacent the non-electrically conductive body to thereby transform the material that is present in the chamber and is adjacent the non-electrically conductive body from a first state into the plasma state, wherein the plasma state of the material includes plasma particles, at least some of which are free radicals of the material; and
chemically reacting the plasma particles with debris at the structure surface to form a new chemical that is released from the structure surface without removing the structure from the chamber of the EUV light source and without halting operation of the structure;
wherein electromagnetically inducing electric current at the location adjacent the non-electrically conductive body comprises flowing an electric current through an electrical conductor adjacent the non-electrically conductive body, and wherein flowing the electrical current through the electrical conductor comprises applying a first electric current at a first frequency to the electrical conductor and a second electric current at a second frequency to the electrical conductor, the second frequency being distinct from the first frequency.

10. An apparatus comprising:
a liner within a chamber of an extreme ultraviolet (EUV) light source, the liner positioned between a collector mirror and an intermediate focus of the collector mirror, the liner including an exposed surface that, when installed, faces EUV light that is reflected from the collector mirror toward the intermediate focus, the liner being made of a non-electrically conductive material; and
a cleaning apparatus configured to remove target debris from the exposed surface of the liner without removing the liner from the chamber, the cleaning apparatus comprising an electrical conductor contacting the liner, the electrical conductor being positioned outside an exterior surface of the liner if the exterior surface of the liner is at a different pressure than a pressure at the exposed surface or the electrical conductor being embedded in the liner if the exterior surface of the liner is held at the same pressure as the exposed surface;
wherein the cleaning apparatus is configured to electromagnetically induce an electric current at a location adjacent the liner to thereby transform a material that is present in the chamber from a first state into a plasma state that includes plasma particles, at least some of which are free radicals and ions of the material, such that the plasma particles come in contact with the debris on the exposed surface of the liner.

11. The apparatus of claim 10, wherein the liner has a conical shape that tapers smoothly from a base positioned adjacent the collector mirror to an apex that opens to the intermediate focus.

12. An apparatus comprising:
an extreme ultraviolet (EUV) light source comprising a structure within a chamber, wherein the structure includes a surface exposed to debris from a target within the chamber, the target comprising matter that emits EUV light when it is converted into a plasma; and
a cleaning apparatus configured to remove target debris from the surface by generating a plasma state of a material present at a location adjacent to the structure, the cleaning apparatus comprising:
an electrical conductor contacting the structure, the electrical conductor being configured to electromagnetically induce an electric current at a location adjacent the structure to thereby transform a material that is present in the chamber from a first state into a plasma state that includes plasma particles, at least some of which are free radicals and ions of the material, and electromagnetically inducing the electric current comprises inducing a surface wave along the surface of the structure by supplying current to the electrical conductor, the current in a range that produces microwave radiation;
wherein the surface wave enables the plasma particles to pass over the structure surface to remove target debris from the structure surface without removing the structure from the chamber and without halting operation of the structure.

13. The apparatus of claim 12, wherein the plasma particles include at least ions, electrons, and free radicals of the material.

14. The apparatus of claim 12, wherein the structure surface is positioned to optically interact with and modify light present in the chamber.

15. The apparatus of claim 12, further comprising a removal apparatus configured to remove the debris from the chamber.

16. The apparatus of claim 12, wherein the microwave radiation has a frequency that lies in a range extending from 1 gigahertz (GHz) to 300 GHz.

* * * * *